United States Patent
Hashimoto et al.

(10) Patent No.: US 9,881,789 B2
(45) Date of Patent: Jan. 30, 2018

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Yoshitomo Hashimoto, Toyama (JP); Yoshiro Hirose, Toyama (JP); Shingo Nohara, Toyama (JP); Ryota Sasajima, Toyama (JP); Katsuyoshi Harada, Toyama (JP); Yuji Urano, Toyama (JP)

(73) Assignee: HITACHI KOKUSAI ELECTRIC, INC., Tokyo (JP)

( * ) Notice: Subject to any disclaimer, the term of this patent is extended or adjusted under 35 U.S.C. 154(b) by 0 days.

(21) Appl. No.: 15/453,731

(22) Filed: Mar. 8, 2017

(65) Prior Publication Data

US 2017/0178902 A1    Jun. 22, 2017

Related U.S. Application Data

(63) Continuation of application No. 15/216,956, filed on Jul. 22, 2016, now Pat. No. 9,620,357.

(30) Foreign Application Priority Data

Jul. 24, 2015 (JP) ................. 2015-147134

(51) Int. Cl.
    H01L 21/02    (2006.01)
    H01L 21/311   (2006.01)
    C23C 16/455   (2006.01)
    C23C 16/52    (2006.01)
    C23C 16/36    (2006.01)
    C23C 16/34    (2006.01)

(52) U.S. Cl.
    CPC ...... *H01L 21/02362* (2013.01); *C23C 16/345* (2013.01); *C23C 16/36* (2013.01);
    (Continued)

(58) Field of Classification Search
    CPC ......... H01L 21/02362; H01L 21/02126; H01L 21/02167; H01L 21/0217; H01L 21/02211;
    (Continued)

(56) References Cited

U.S. PATENT DOCUMENTS

2005/0101135 A1    5/2005  Annapragada et al.
2008/0246125 A1   10/2008  Kikuchi
(Continued)

FOREIGN PATENT DOCUMENTS

EP    2003687         * 12/2008
JP    2007-273873 A     10/2007
JP    2013-140944 A      7/2013

*Primary Examiner* — Yasser A Abdelaziez
(74) *Attorney, Agent, or Firm* — Volpe and Koenig, P.C.

(57) ABSTRACT

A method of manufacturing a semiconductor device includes: providing a substrate having an oxide film; performing, a predetermined number of times, a cycle of non-simultaneously performing supplying a precursor gas to the substrate, supplying a carbon-containing gas to the substrate, and supplying a nitrogen-containing gas to the substrate, or performing, a predetermined number of times, a cycle of non-simultaneously performing supplying a precursor gas to the substrate and supplying a gas containing carbon and nitrogen to the substrate, or performing, a predetermined number of times, a cycle of non-simultaneously performing supplying a precursor gas containing carbon to the substrate and supplying a nitrogen-containing gas to the substrate, the oxide film being used as an oxygen source to form a nitride layer containing oxygen and carbon as a seed layer; and forming a nitride film containing no oxygen and carbon as a first film on the seed layer.

10 Claims, 12 Drawing Sheets

(52) U.S. Cl.
CPC ........ *C23C 16/45544* (2013.01); *C23C 16/52* (2013.01); *H01L 21/0217* (2013.01); *H01L 21/0228* (2013.01); *H01L 21/02126* (2013.01); *H01L 21/02167* (2013.01); *H01L 21/02211* (2013.01); *H01L 21/02326* (2013.01); *H01L 21/31144* (2013.01)

(58) Field of Classification Search
CPC ........... H01L 21/0228; H01L 21/02326; H01L 21/31144; C23C 16/345; C23C 16/36; C23C 16/45544; C23C 16/52
See application file for complete search history.

(56) References Cited

U.S. PATENT DOCUMENTS

| | | | |
|---|---|---|---|
| 2010/0022048 A1* | 1/2010 | Matsuoka | H01L 21/02115 438/99 |
| 2010/0130024 A1* | 5/2010 | Takasawa | C23C 16/45531 438/761 |
| 2013/0052836 A1 | 2/2013 | Hirose et al. | |
| 2013/0149873 A1 | 6/2013 | Hirose et al. | |
| 2013/0252439 A1* | 9/2013 | Hirose | C23C 16/30 438/778 |
| 2015/0162185 A1 | 6/2015 | Pore | |
| 2015/0228474 A1 | 8/2015 | Hanashima et al. | |

\* cited by examiner ized in one embodiment of the present disclosure,
where the processing furnace part is illustrated in a longitudinal cross-sectional view.

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is a continuation of U.S. patent application Ser. No. 15/216,956, filed Jul. 22, 2016, which is based upon and claims the benefit of priority from Japanese Patent Application No. 2015-147134, filed on Jul. 24, 2015, the entire contents of which are incorporated herein by reference.

TECHNICAL FIELD

The present disclosure relates to a method of manufacturing a semiconductor device, a substrate processing apparatus, and a recording medium.

BACKGROUND

As one of the processes of manufacturing a semiconductor device, a process of forming a nitride film, such as a silicon nitride film ($Si_3N_4$ film, hereinafter, also referred to as a SiN film), as a protective film on a substrate with an oxide film, such as a silicon oxide film ($SiO_2$ film, hereinafter, also referred to as a SiO film), formed on a surface thereof may be performed. When an etching process is performed on the substrate, the nitride film formed on the oxide film may be used as an etching stopper or the like to protect the oxide film.

However, when a film thickness of the nitride film is small, the function of the nitride film as a protective film may be degraded. As a result, the oxide film may be damaged when the etching process is performed on the substrate.

SUMMARY

The present disclosure provides some embodiments of a technique capable of suppressing degradation of the function of a nitride film as a protective film.

According to one embodiment of the present disclosure, there is provided a technique, including: providing a substrate having an oxide film formed on a surface of the substrate; performing, a predetermined number of times, a cycle of non-simultaneously performing a process of supplying a precursor gas to the substrate, a process of supplying a carbon-containing gas to the substrate, and a process of supplying a nitrogen-containing gas to the substrate, or performing, a predetermined number of times, a cycle of non-simultaneously performing a process of supplying a precursor gas to the substrate and a process of supplying a gas containing carbon and nitrogen to the substrate, or performing, a predetermined number of times, a cycle of non-simultaneously performing a process of supplying a precursor gas containing carbon to the substrate and a process of supplying a nitrogen-containing gas to the substrate, wherein the oxide film is used as an oxygen source to form a nitride layer containing oxygen and carbon as a seed layer on the oxide film; and forming a nitride film containing no oxygen and carbon as a first film on the seed layer.

DETAILED DESCRIPTION

<Idea Acquired by Inventors>

In performing a film forming process of supplying a precursor gas and a nitrogen (N)-containing gas to a heated substrate to form a nitride film on the substrate, if an oxide film has been formed on the surface of the substrate, oxygen (O) contained in the oxide film may be introduced near an interface between the nitride film and the oxide film during the film forming process. The nitride layer (oxynitride layer) containing O is a layer having a composition different from that of a film to be formed on the substrate, i.e., a nitride film not containing O, which may be a factor of degrading a wet etch resistance or a dry etch resistance (hereinafter, also referred to simply as etch resistance) of the film. Thus, the nitride layer containing O is also called a degradation layer (interface degradation layer) or a transition layer (interface transition layer). The interface transition layer is hardly formed at a room temperature after the film forming process is completed, but it may be occasionally formed at high temperatures such as a film-forming temperature of the nitride film, etc.

The extent of a layer into which O is introduced, i.e., the thickness of the interface transition layer, is about 30 Å. Thus, when a film thickness of the nitride film formed on the oxide film is about 30 Å, most of the film formed on the substrate may be occupied by the interface transition layer or the entire film may become a nitride film containing O. The nitride film in which the interface transition layer accounts for a large proportion may have a drastically degraded etch resistance, compared with a nitride film not containing O.

The inventors did extensive research to solve the aforementioned problems. As a result, the inventors acquired the idea that the aforementioned problems can be solved by performing a process of forming a seed layer containing O, carbon (C), and N on an underlying oxide film using the underlying oxide film as an oxygen source, and a process of forming a nitride film not containing O on the seed layer while using the seed layer as a block layer for preventing the spread of O. The present disclosure is devised based on the foregoing idea.

<One Embodiment>

One embodiment of the present disclosure will now be described with reference to FIGS. 1 to 4.

(1) Configuration of Substrate Processing Apparatus

Figure 1:
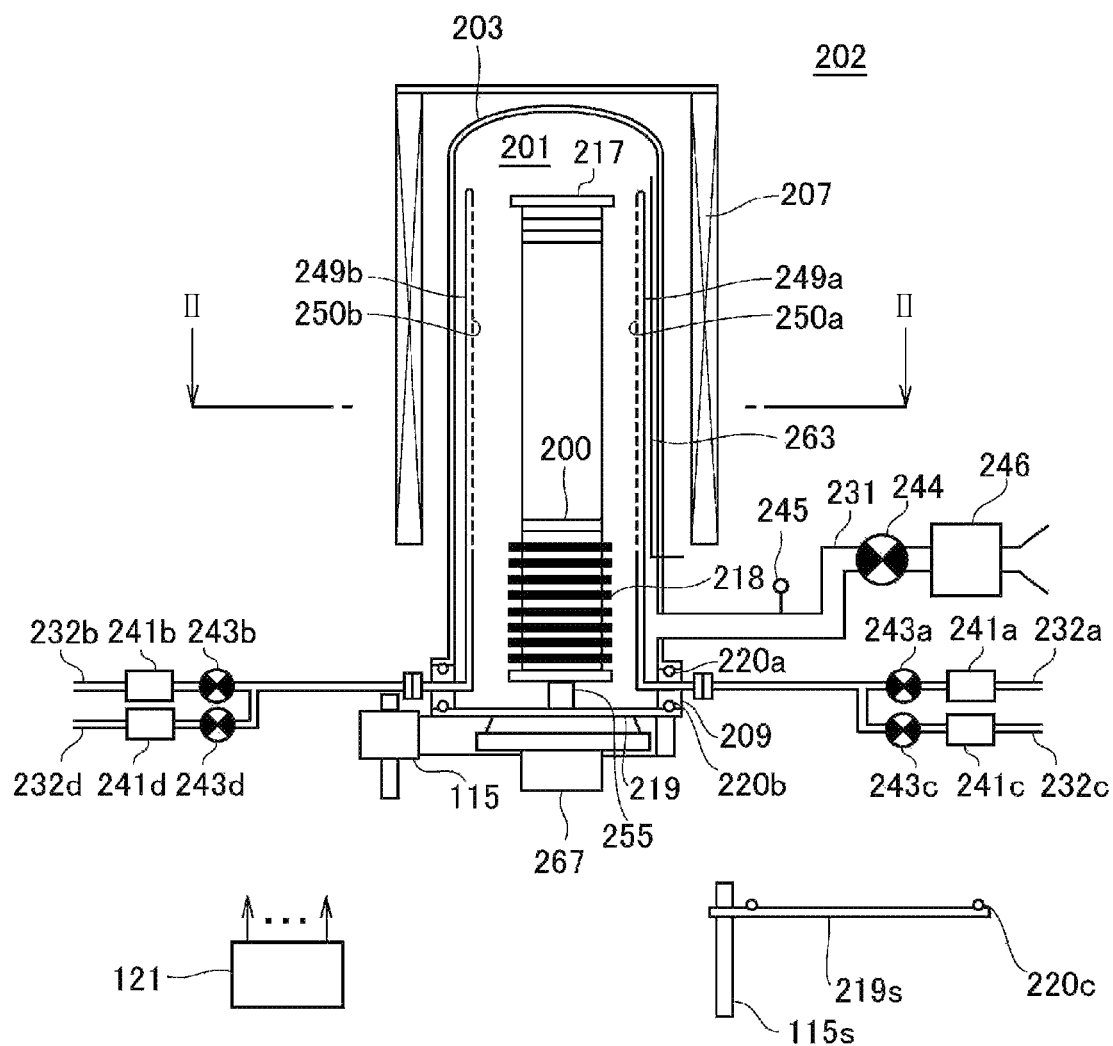
FIG. 1 is a schematic configuration diagram of a vertical processing furnace of a substrate processing apparatus applicably used in one embodiment of the present disclosure, where the processing furnace part is illustrated in a longitudinal cross-sectional view.
Figure 2:
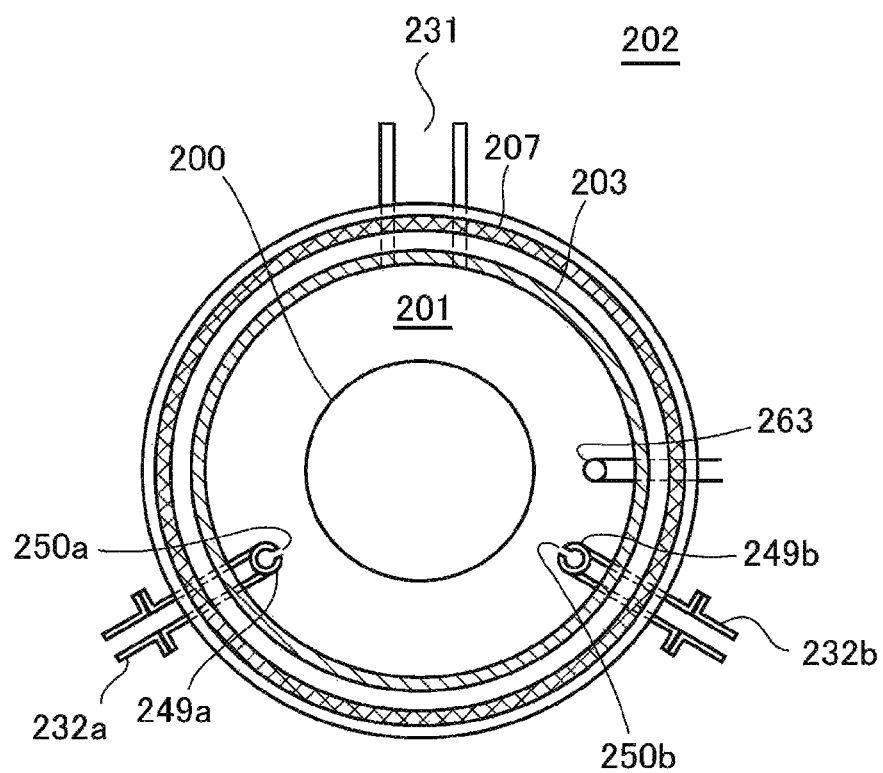
FIG. 2 is a partial schematic configuration diagram of a vertical processing furnace of a substrate processing apparatus applicably used in one embodiment of the present disclosure, where a part of the processing furnace is illustrated in a cross-sectional view taken along line II-II of FIG. 1.

First, a configuration of a substrate processing apparatus as a first substrate processing part will be described with reference to FIGS. 1 to 3. As shown in FIG. 1, a processing furnace 202 has a heater 207 as a heating mechanism (temperature adjusting part). The heater 207 having a cylindrical shape is vertically installed and supported by a heater base (not shown) serving as a support plate. The heater 207 also functions as an activation mechanism (excitation part) to thermally activate (excite) a gas, as described later.

A reaction tube 203 is disposed inside the heater 207 to be concentric with the heater 207. The reaction tube 203 is made of a heat resistant material such as, for example, quartz ($SiO_2$) or silicon carbide (SiC), and has a cylindrical shape with its upper end closed and its lower end opened. A manifold (inlet flange) 209 is disposed below the reaction tube 203 to be concentric with the reaction tube 203. The manifold 209 is made of a metal such as, for example, stainless steel (SUS), and has a cylindrical shape with its upper end and lower end opened. An upper end portion of the manifold 209 is engaged with a lower end of the reaction tube 203 to support the reaction tube 203. An O-ring 220a serving as a seal member is installed between the manifold 209 and the reaction tube 203. As the manifold 209 is supported by the heater base, the reaction tube 203 is vertically installed. A process vessel (reaction vessel) mainly includes the reaction tube 203 and the manifold 209. A process chamber 201 is formed in a cylindrical hollow portion of the process vessel. The process chamber 201 is configured to accommodate wafers 200 as a plurality of substrates while the wafers 200 are horizontally arranged in a vertical direction and in a multi-stage manner in a boat 217, which will be described later.

Nozzles 249a and 249b are installed in the process chamber 201 to pass through a sidewall of the manifold 209. Gas supply pipes 232a and 232b are connected to the nozzles 249a and 249b, respectively. In this manner, the two nozzles 249a and 249b, and the two gas supply pipes 232a and 232b are installed in the process vessel (manifold 209), and are configured to supply plural kinds of gases into the process chamber 201.

Mass flow controllers (MFCs) 241a and 241b, which are flow rate controllers (flow rate control parts), and valves 243a and 243b, which are opening/closing valves, are installed in the gas supply pipes 232a and 232b in this order from an upstream side, respectively. Gas supply pipes 232c and 232d configured to supply an inert gas are connected to the gas supply pipes 232a and 232b at downstream sides of the valves 243a and 243b, respectively. MFCs 241c and 241d, which are flow rate controllers (flow rate control parts), and valves 243c and 243d, which are opening/closing valves, are installed in the gas supply pipes 232c and 232d in this order from the upstream side, respectively.

Nozzles 249a and 249b are connected to leading ends of the gas supply pipes 232a and 232b, respectively. As illustrated in FIG. 2, the nozzles 249a and 249b are respectively installed in an annular space in plan view between the inner wall of the reaction tube 203 and the wafers 200, so as to extend upward along a loading direction of the wafers 200 from the lower portion of the inner wall of the reaction tube 203 to the upper portion thereof. That is, the nozzles 249a and 249b are respectively installed in a region, at a lateral side of a wafer arrangement region in which the wafers 200 are arranged, which horizontally surrounds the wafer arrangement region, so that they extend along the wafer arrangement region. That is to say, the nozzle 249a and 249b are respectively installed, in a direction perpendicular to the surface (flat surface) of the wafer 200, at a lateral side of the end portion (peripheral portion) of each of the wafers 200 loaded into the process chamber 201. Each of the nozzles 249a and 249b is configured as an L-shaped long nozzle, and a horizontal portion of each of the nozzles 249a and 249b is installed to pass through a sidewall of the manifold 209 and a vertical portion thereof is installed to extend upward at least from one end side of the wafer arrangement region toward the other end side thereof. Gas supply holes 250a and 250b, through which gases are supplied, are respectively formed on side surfaces of the nozzles 249a and 249b. The gas supply holes 250a and 250b are respectively opened toward the center of the reaction tube 203 to allow supplying gases toward the wafers 200. A plurality of the gas supply holes 250a and 250b are formed over a region spanning from the lower portion of the reaction tube 203 to the upper portion thereof, and each of the gas supply holes 250a and 250b has the same opening area and is formed at the same opening pitch.

As described above, in this embodiment, the gas is transferred though the nozzles 249a and 249b disposed in a vertical-elongated space of an annular shape (when viewed from the plane), i.e., a cylindrical space, defined by the inner wall of the sidewall of the reaction tube 203 and the end portions (peripheral portions) of the plurality of wafers 200 arranged in the reaction tube 203. Then, the gas is initially ejected into the reaction tube 203 near the wafers 200 through the opened gas supply holes 410a, 420a and 430a of the nozzles 249a and 249b, respectively, and a main flow of the gas in the reaction tube 203 is oriented in a direction parallel to the surfaces of the wafers 200, i.e., a horizontal direction. With this configuration, the gas can be uniformly supplied to the respective wafers 200. This can enhance the uniformity of a thickness of a film formed on each of the wafers 200. The gas flowing on the surfaces of the wafers 200, i.e., the reacted residual gas, flows toward an exhaust port, i.e., an exhaust pipe 231 described later. However, the flow direction of the residual gas is not limited to a vertical direction but may be applicably decided depending on a position of the exhaust port.

A precursor gas (precursor) containing a specified element, for example, a halosilane precursor gas containing a silicon (Si) as a specified element and a halogen element, is supplied from the gas supply pipe 232a into the process chamber 201 through the MFC 241a, the valve 243a, and the nozzle 249a.

The precursor gas refers to a precursor in a gaseous state, for example, a gas obtained by vaporizing a precursor in a liquid state under a room temperature and a normal pressure, a precursor in a gaseous state under a room temperature and a normal pressure, or the like. The halosilane precursor is a silane precursor containing a halogen group. The halogen group includes a chloro group, a fluoro group, a bromo group, an iodine group, and the like. That is, the halogen group includes a halogen element such as chlorine (Cl), fluorine (F), bromine (Br), or iodine (I). The halosilane precursor may refer to one kind of halogenide. When the term "precursor" is used herein, it may mean "a liquid precursor in a liquid state," "a precursor gas in a gaseous state", or both.

As the halosilane precursor gas, a precursor gas containing, for example, Si and Cl, namely, a chlorosilane precursor gas, may be used. The chlorosilane precursor gas acts as a silicon source (Si source) in a film forming process described later. As the chlorosilane precursor gas, for example, a hexachlorodisilane ($Si_2Cl_6$, abbreviation: HDCS) gas, may be used.

A gas containing, for example, carbon (C) and nitrogen (N), as a reaction gas (reactant) having a chemical structure (molecular structure) different from that of a precursor, is supplied from the gas supply pipe 232b into the process chamber 201 through the MFC 241b, the valve 243b, and the nozzle 249b. As the gas containing C and N, for example, an amine-based gas may be used.

The amine-based gas is gaseous amine, for example, a gas which is obtained by vaporizing amine remaining in a liquid state under a room temperature and a normal pressure or a gas which contains an amine group such as amine in a gaseous state under a room temperature and a normal pressure. The amine-based gas contains amine such as ethylamine, methylamine, propylamine, isopropylamine, butylamine, isobutylamine, or the like. The term "amine" is a generic name of compounds in which hydrogen (H) of ammonia ($NH_3$) is substituted with a hydrocarbon group such as an alkyl group. Amine contains a hydrocarbon group such as an alkyl group or the like as a ligand containing C, namely, an organic ligand. Since the amine-based gas contains three elements C, N, and H but does not contain Si, it may be referred to as a Si-free gas. Since the amine-based gas does not contain Si and metal, it may be referred to as a Si-free and metal-free gas. The amine-based gas may be a substance consisting of only three elements C, N and H. The amine-based gas acts as a C source and as an N source in a film forming process described later. The term "amine" used herein means "amine remaining in a liquid state", an "amine-based gas remaining in a gaseous state", or both.

As the amine-based gas, it may be possible to use, for example, a triethylamine (($C_2H_5$)$_3$N, abbreviation: TEA) gas in which the number of C-containing ligands (ethyl groups) in the chemical structural formula (in one molecule) is multiple and in which the number of C in one molecule is larger than the number of N. In the case of using amine in a liquid state under a room temperature and a normal pressure such as TEA, the amine in a liquid state is vaporized by a vaporization system such as a vaporizer or a bubbler and is supplied as an amine-based gas (TEA gas).

A reaction gas (reactant) having a chemical structure (molecular structure) different from that of a precursor, for example, an N-containing gas, is supplied from the gas supply pipe 232b into the process chamber 201 through the MFC 241b, the valve 243b, and the nozzle 249b. As the N-containing gas, for example, a hydrogen nitride-based gas may be used. The hydrogen nitride-based gas may be a substance consisting of only two elements N and H, and acts as a nitriding gas, i.e., an N source, in the film forming process described later. As the hydrogen nitriding gas, for example, an ammonia ($NH_3$) gas may be used.

A reaction gas (reactant) having a chemical structure (molecular structure) different from that of a precursor, for example, a C-containing gas, is supplied from the gas supply pipe 232b into the process chamber 201 through the MFC 241b, the valve 243b, and the nozzle 249b. As the C-containing gas, for example, a hydrocarbon-based gas may be used. The hydrocarbon-based gas may be a substance consisting of only two elements C and H, and acts as a C source, in the film forming process described later. As the hydrocarbon-based gas, for example, a propylene ($C_3H_6$) gas may be used.

An inert gas, for example, a nitrogen ($N_2$) gas, is supplied from the gas supply pipes 232c and 232d into the process chamber 201 through the MFCs 241c and 241d, the valves 243c and 243d, the gas supply pipes 232a and 232b, and the nozzles 249a and 249b, respectively.

When a precursor gas is supplied from the gas supply pipe 232a, a precursor gas supply system is mainly configured by the gas supply pipe 232a, the MFC 241a, and the valve 243a. It may be considered that the nozzle 249a is included in the precursor gas supply system. The precursor gas supply system may be referred to as a precursor supply system. When the halosilane precursor gas is supplied from the gas supply pipe 232a, the precursor gas supply system may be referred to as a halosilane precursor gas supply system or a halosilane precursor supply system.

When a C- and N-containing gas is supplied from the gas supply pipe 232b, a C- and N-containing gas supply system is mainly configured by the gas supply pipe 232b, the MFC 241b, and the valve 243b. It may be considered that the nozzle 249b is included in the C- and N-containing gas supply system. When an amine-based gas is supplied from the gas supply pipe 232b, the C- and N-containing gas supply system may be referred to as an amine-based gas supply system or an amine supply system. Since the C- and N-containing gas may be a C-containing gas or an N-containing gas, it may be also considered that the C- and N-containing gas supply system is included in a C-containing gas supply system or an N-containing gas supply system described later.

When an N-containing gas is supplied from the gas supply pipe 232b, the N-containing gas supply system is mainly configured by the gas supply pipe 232b, the MFC 241b, and the valve 243b. It may be considered that the nozzle 249b is included in the N-containing gas supply system. The N-containing gas supply system may be referred to as a nitriding gas supply system or a nitriding agent supply system. When a hydrogen nitride-based gas is supplied from the gas supply pipe 232b, the N-containing gas supply system may be referred to as a hydrogen nitride-based gas supply system or a hydrogen nitride supply system.

When a C-containing gas is supplied from the gas supply pipe 232b, a C-containing gas supply system is mainly configured by the gas supply pipe 232b, the MFC 241b, and the valve 243b. It may be considered that the nozzle 249b is included in the C-containing gas supply system. When a hydrocarbon-based gas is supplied from the gas supply pipe 232b, the C-containing gas supply system may be referred to as a hydrocarbon-based gas supply system or a hydrocarbon supply system.

Any one or all of the gas supply systems described above may be referred to as a process gas supply system or simply a supply system. Also, any one or all of the C- and N-containing gas supply systems, the N-containing gas supply system, and the C-containing gas supply system described above may be referred to as a reaction gas supply system.

Further, an inert gas supply system is mainly configured by the gas supply pipes 232c and 232d, the MFCs 241c and 241d, the valves 243c and 243d.

The exhaust pipe 231 for exhausting an internal atmosphere of the process chamber 201 is installed in the reaction tube 203. A vacuum pump 246 serving as a vacuum exhaust device are connected to the exhaust pipe 231 via a pressures sensor 245, which is a pressure detector (pressure detecting part) for detecting an internal pressure of the process chamber 201, and an auto pressure controller (APC) valve 244, which is a pressure regulator (pressure regulating part). The APC valve 244 is configured to perform/stop vacuum exhaust in the internal atmosphere of the process chamber 201 by opening/closing the valve with the vacuum pump 246 actuated, and also configured to regulate the internal pressure of the process chamber 201 by adjusting an opening degree of the valve based on the pressure information detected by the pressure sensor 245 while keeping the vacuum pump 246 actuated. An exhaust system is mainly configured by the exhaust pipe 231, the APC valve 244, and the pressure sensor 245. It may be considered that the vacuum pump 246 is included in the exhaust system.

A seal cap 219, which serves as a furnace port cover configured to hermetically seal a lower end opening of the manifold 209, is installed under the manifold 209. The seal cap 219 is configured to make contact with the lower end of the manifold 209 at the lower side in the vertical direction. The seal cap 219 is formed of a metal such as, for example, SUS, and have a disc shape. An O-ring 220b, which is a seal member making contact with the lower end portion of the manifold 209, is installed on an upper surface of the seal cap 219. A rotation mechanism 267 configured to rotate the boat 217 to be described later is installed at an opposite side of the seal cap 219 from the process chamber 201. A rotary shaft 255 of the rotation mechanism 267, which passes through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevation mechanism vertically installed outside the reaction tube 203. The boat elevator 115 is configured to load and unload the boat 217 into and from the process chamber 201 by moving the seal cap 219 up and down. The boat elevator 115 is configured as a transfer device (transfer mechanism) that transfers the boat 217, i.e., the wafers 200, into and out of the process chamber 201. In addition, a shutter 219s, which serves as a furnace port cover configured to hermetically seal the lower end opening of the manifold 209, is installed under the manifold 209 while the seal cap 219 is lowered by the boat elevator 115. The shutter 219s is formed of a metal such as, for example, SUS, and have a disc shape. An O-ring 220c, which is a seal member making contact with the lower end portion of the manifold 209, is installed on an upper surface of the shutter 219s. The opening/closing operation (elevation operation, rotation operation or the like) of the shutter 219s is controlled by a shutter opening/closing mechanism 115s.

The boat 217 as a substrate support is configured to support a plurality of, e.g., 25 to 200 wafers, in a manner such that the wafers 200 are horizontally stacked in a vertical direction and multiple stages, i.e., being separated from each other, with the centers of the wafers 200 aligned with one another. The boat 217 is form of a heat resistant material such as, for example, quartz or SiC. Heat insulating plates 218 made of a heat resistant material such as, for example, quartz or SiC are installed below the boat 217 in a multi-stage manner. With this configuration, the heat generated from the heater 207 is hardly transferred to the seal cap 219. However, this embodiment is not limited thereto. Instead of installing the heat insulating plates 218 below the boat 217, for example, a heat insulating tube as a tubular member made of a heat resistant material such as quartz or SiC may be installed below the boat 217.

A temperature sensor 263, which is a temperature detector, is installed in the reaction tube 203. Based on temperature information detected by the temperature sensor 263, the state of current being applied to the heater 207 is adjusted such that the interior of the process chamber 201 has a desired temperature distribution. Similar to the nozzles 249a and 249b, the temperature sensor 263 is configured to have an L shape, and is installed along the inner wall of the reaction tube 203.

Figure 3:
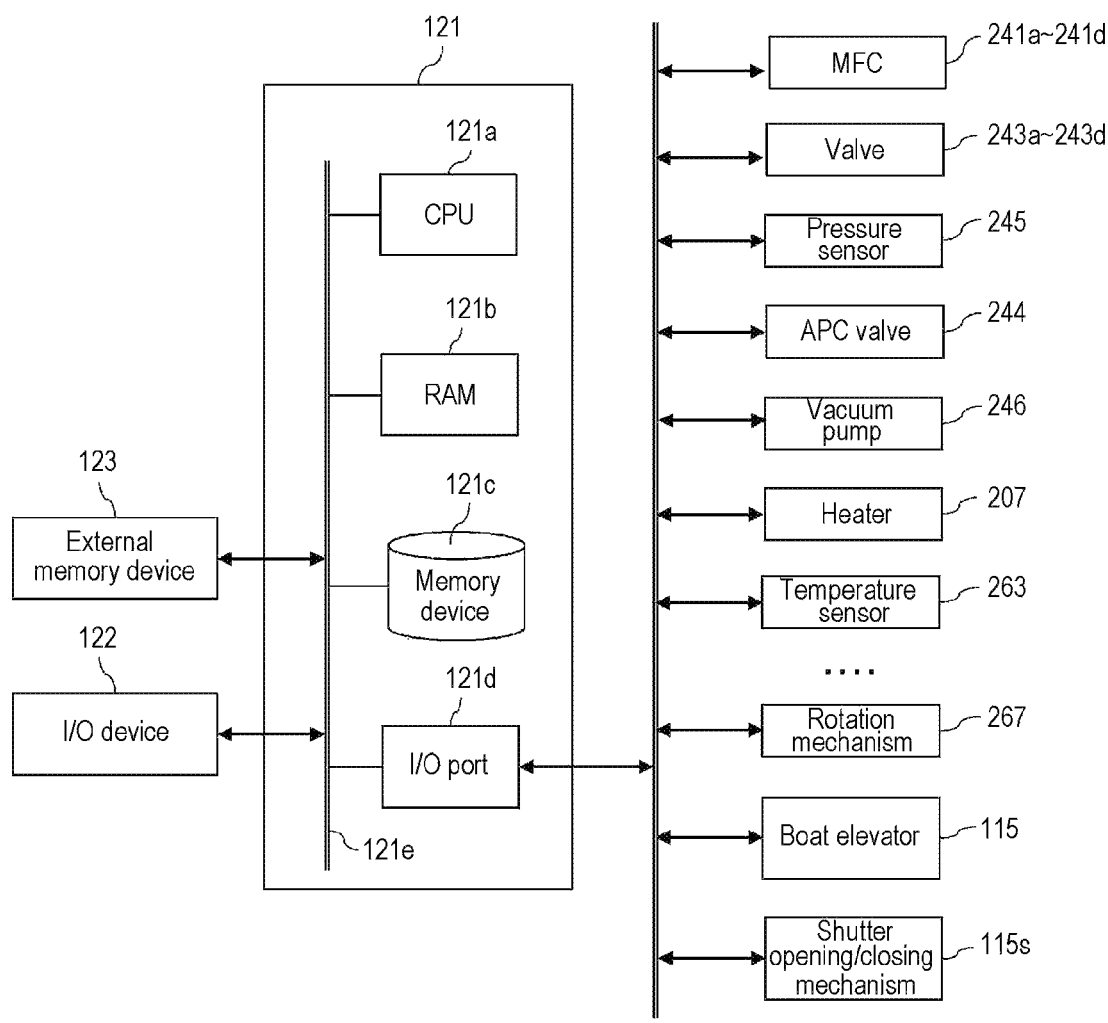
FIG. 3 is a schematic configuration diagram of a controller of the substrate processing apparatus applicably used in one embodiment of the present disclosure, where a control system of the controller is illustrated in a block diagram.

As illustrated in FIG. 3, a controller 121, which is a control part (control means), is configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 configured as, for example, a touch panel or the like is connected to the controller 121.

The memory device 121c is configured by, for example, a flash memory, a hard disc drive (HDD), or the like. A control program for controlling the operation of the substrate processing apparatus, a process recipe in which the sequences, conditions or the like of the film forming process described later are written, and the like are readably stored in the memory device 121c. The process recipe, which is a combination of sequences, causes the controller 121 to execute each sequence in the film forming process described later in order to obtain a predetermined result, and functions as a program. Hereinafter, the program recipe, the control program, or the like may be generally referred to simply as a program. Also, the process recipe will be simply referred to as a recipe. When the term "program" is used herein, it is intended to encompass only the recipe, only the control program, or both. The RAM 121b is configured as a memory area (work area) in which a program, data, or the like read by the CPU 121a is temporarily stored.

The I/O port 121d is connected to the MFCs 241a to 241d, the valves 243a to 243d, the pressure sensor 245, the APC valve 244, the vacuum pump 246, the temperature sensor 263, the heater 207, the rotation mechanism 267, the boat elevator 115, the shutter opening/closing mechanism 115s, and the like as described above.

The CPU 121a is configured to read and execute the control program from the memory device 121c, and also to read the recipe from the memory device 121c as an operation command is input from the input/output device 122. The CPU 121a is configured to, according to the content of the read recipe, control a flow rate adjusting operation of various kinds of gases by the MFCs 241a to 241d, an opening/closing operation of the valves 243a to 243d, an opening/closing operation of the APC valve 243, a pressure regulating operation by the APC valve 243 based on the pressure sensor 245, a start/stop operation of the vacuum pump 246, a temperature adjusting operation of the heater 207 based on the temperature sensor 263, a rotation operation and a rotation speed adjusting operation of the boat 217 by the rotation mechanism 267, an operation of moving the boat 217 up and down by the boat elevator 115, an opening/closing operation of the shutter 219s by the shutter opening/closing mechanism 115s, and the like.

The controller 121 may be configured by installing the program, which is stored in an external memory device (for example, a magnetic tape, a magnetic disc such as a flexible disc or a hard disc, an optical disc such as a compact disc (CD) or a digital versatile disc (DVD), a magneto-optical (MO) disc, a semiconductor memory such as a universal serial bus (USB) memory or a memory card, etc.) 123, on the computer. The memory device 121c or the external memory device 123 is configured as a non-transitory computer-readable recording medium. Hereinafter, they will be generally referred to simply as "a recording medium." When the term "recording medium" is used herein, it intended to encompass only the memory device 121c, only the external memory device 123, or both. Also, the program may be supplied to the computer through the use of a communication means such as the Internet or a dedicated line, without having to go through the external memory device 123.

(2) Film Forming Process

An example of a sequence of forming a protective film on a substrate on which the oxide film is formed, which is one of the processes of manufacturing a semiconductor device using the aforementioned substrate processing apparatus, will be described with reference to FIG. 4. In the following description, the operations of the respective parts constituting the substrate processing apparatus are controlled by the controller 121.

Figure 4:
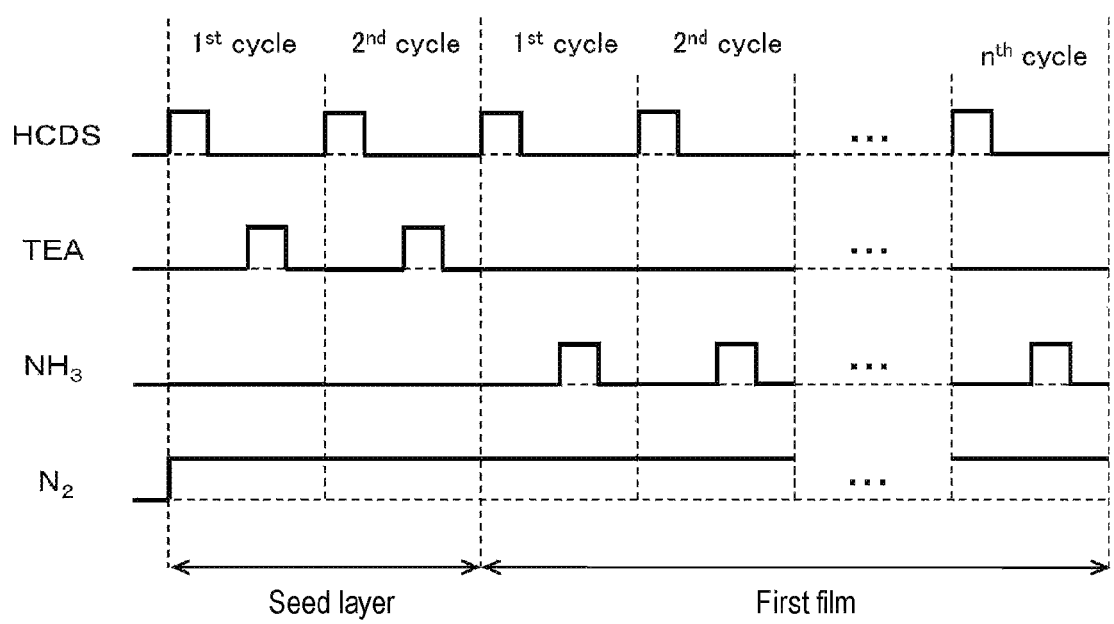
FIG. 4 is a diagram illustrating a timing of the gas supply in a film forming sequence according to one embodiment of the present disclosure.

In a film forming sequence illustrated in FIG. 4, the following steps are performed:

a step of providing a wafer 200 as a substrate on which a silicon oxide film (SiO film) is formed on a surface as an oxide film (substrate preparation step), a step of performing a cycle of non-simultaneously (alternately) performing step 1a of supplying an HCDS gas as a precursor gas to the wafer 200 and step 1b of supplying a TEA gas as a gas containing C and N to the wafer 200 a predetermined number of times ($m_1$ times), wherein the SiO film is used as an O source to form a silicon oxycarbonitride layer (SiOCN layer) on the SiO film, as a nitride layer containing O and C and as a seed layer (seed layer forming step), and a step of forming a silicon nitride film (hereinafter, referred to as a "first SiN film" or simply as an "SiN film"), on the seed layer, as a nitride film not containing O and C and as a first film (a first film forming step).

In addition, in the first film forming step illustrated in FIG. 4, a cycle of non-simultaneously performing step 2a of supplying an HCDS gas as a precursor gas to the wafer 200 and step 2b of supplying a NH$_3$ gas as an N-containing gas to the wafer 200 is performed a predetermined number of times ($n_1$ times). Further, in the first film forming step, the seed layer is used as a block layer for suppressing the spreading of O to the first SiN film from the SiO film.

In the above, $m_1$ is an integer of 1 or greater. FIG. 4 illustrates an example in which $m_1$ is 2. Further, $n_1$ is an integer greater than $m_1$, i.e., an integer of 2 or greater. In the present disclosure, the sequence of the film forming process illustrated in FIG. 4 is illustrated as follows for the convenience of description. The same marks will be also used in the description of the following modifications or other embodiments.

When the term "wafer" is used herein, it should be understood as either a "wafer per se," or "the wafer and a layered body (aggregate) of certain layers or films formed on a surface of the wafer", that is, certain layers or films formed on the surface of the wafer is collectively referred to as a wafer. Also, the term "surface of a wafer" is used herein, it should be understood as either a "surface (exposed surface) of a wafer per se," or a "surface of a certain layer or film formed on the wafer, i.e., an outermost surface of the wafer as a layered body."

Thus, in the present disclosure, the expression "a specified gas is supplied to a wafer" may mean that "the specified gas is directly supplied to a surface (exposed surface) of a wafer per se," or that "the specified gas is supplied to a surface of a certain layer or film formed on the wafer, i.e., to an outermost surface of the wafer as a layered body." Also, in the present disclosure, the expression "a certain layer (or film) is formed on a wafer" may mean that "the certain layer (or film) is directly formed on the surface (exposed surface) of the wafer per se," or that "the certain layer (or film) is formed on the surface of a certain layer or film formed on the wafer, i.e., on an outermost surface of the wafer as a layered body."

Also, in the present disclosure, the term "substrate" is interchangeably used with the term "wafer."

(Substrate Preparation Step)

When a plurality of wafers 200 are loaded on the boat 217 (wafer charging), the shutter 219s is moved by the shutter opening/closing mechanism 115s and the lower end opening of the manifold 209 is opened (shutter open). Thereafter, as illustrated in FIG. 1, the boat 217 supporting the plurality of wafers 200 is lifted up by the boat elevator 115 to be loaded into the process chamber 201 (boat loading). In this state, the seal cap 219 seals the lower end of the manifold 209 via the O-ring 220b.

As described above, the SiO film as an oxide film is formed in advance on at least a portion of the surface of the wafer 200. This film serves as a supply source of O added to a seed layer, i.e., a source of O, in a seed layer forming step described later. Also, this film becomes at least part of a base film when a protective film is formed, in the seed layer forming step described later. Also, this film may be a film to be protected by the protective film in an etching process described later. The SiO film may be formed to cover the entire surface of the wafer 200 or may be formed to cover only a portion thereof. As the oxide film, it may be possible to form not only the SiO film but also a Si-containing film such as, for example, a silicon oxynitride film (SiON film), a silicon oxycarbide film (SiOC film), or a silicon oxycarbonitride film (SiOCN film), or a metal oxide film, i.e., a high dielectric constant insulating film (high-k film), such as an aluminum oxide film (AlO film), a hafnium oxide film (HfO film), a zirconium oxide film (ZrO film), or a titanium oxide film (TiO film). The oxide film (or the oxynitride film, the oxycarbide film, or the oxycarbonitride film) mentioned herein includes a natural oxide film which is naturally formed as the wafer 200 is exposed to the atmosphere while being transferred, in addition to an oxide film which is intentionally formed by performing predetermined processing such as, for example, CVD processing, plasma CVD processing, thermal oxidation processing, or plasma oxidation processing.

(Pressure and Temperature Adjustment Step)

Vacuum exhaust (decompression exhaust) is performed by the vacuum pump 246 such that the internal pressure of the process chamber 201, i.e., the pressure of a space where the wafers 200 exist becomes equal to a desired pressure (vacuum level). At this time, the internal pressure of the process chamber 201 is measured by the pressure sensor 245, and the APC valve 243 is feedback-controlled based on the measured pressure information. The vacuum pump 246 remains activated at least until the film forming process described later is completed. Further, the wafers 200 in the process chamber 201 are heated by the heater 207 to a desired temperature. At this time, the state of current being applied to the heater 207 is feedback-controlled based on the temperature information detected by the temperature sensor 263 such that the interior of the process chamber 201 has a desired temperature distribution (temperature adjustment). The heating of the interior of the process chamber 201 by the heater 207 is continuously performed at least until the film forming process described later is completed. Subsequently, the boat 217 and wafers 200 begin to be rotated by the rotation mechanism 267. The rotation of the boat 217 and wafers 200 by the rotation mechanism 267 is continuously performed at least until the film forming process described later is completed.

(Seed Layer Forming Step)

Thereafter, the following two steps, i.e., steps 1a and 1b, are performed.

[Step 1a]

At this step, an HCDS gas is supplied to the wafers 200 in the process chamber 201.

Specifically, the valve 243a is opened to cause the HCDS gas to flow through the gas supply pipe 232a. A flow rate of the HCDS gas is adjusted by the MFC 241a, and the flow rate-adjusted HCDS gas is supplied into the process chamber 201 through the nozzle 249a and then exhausted through the exhaust pipe 231. At this time, the HCDS gas is supplied to the wafers 200. At the same time, the valve 243c is opened to cause an $N_2$ gas to flow through the gas supply pipe 232c. A flow rate of the $N_2$ gas is adjusted by the MFC 241c, and the flow rate-adjusted $N_2$ gas is supplied into the process chamber 201 together with the HCDS gas and then exhausted through the exhaust pipe 231.

Further, in order to prevent infiltration of the HCDS gas into the nozzle 249b, the valve 243d is opened to cause the $N_2$ gas to flow through the gas supply pipe 232d. The $N_2$ gas is supplied into the process chamber 201 through the gas supply pipe 232b and the nozzle 249b, and then exhausted through the exhaust pipe 231.

At this time, the APC valve 244 is appropriately adjusted such that the internal pressure of the process chamber 201 falls within a range of, e.g., 1 to 2666 Pa, preferably, 67 to 1333 Pa. A supply flow rate of the HCDS gas controlled by the MFC 241a is set to fall within a range of, e.g., 1 to 2000 sccm, preferably, 10 to 1000 sccm. Supply flow rates of the $N_2$ gas controlled by the MFCs 241c and 241d are set to fall within a range of, e.g., 100 to 10000 sccm, respectively. A time period during which the HCDS gas is supplied to the wafer 200 is set to fall within a range of, e.g., 1 to 120 seconds, preferably, 1 to 60 seconds. The temperature of the heater 207 is set such that the temperature of the wafer 200 falls within a range of, e.g., 250 to 700 degrees C., preferably, 300 to 650 degrees C., more preferably, 350 to 600 degrees C.

If the temperature of the wafer 200 is less than 250 degrees C., a practical deposition rate may not be obtained because the HCDS is hardly chemisorbed onto the wafer 200. This may be solved by setting the temperature of the wafer 200 at 250 degrees C. or higher. By setting the temperature of the wafer 200 at 300 degrees C. or higher, further, 350 degrees C. or higher, it becomes possible to further sufficiently adsorb the HCDS onto the wafer 200 and to obtain a further sufficient deposition rate.

If the temperature of the wafer 200 exceeds 700 degrees C., an excessive vapor phase reaction occurs to degrade the film thickness uniformity, making it difficult to control the film thickness uniformity. By adjusting the temperature of the wafer to 700 degrees C. or less, i.e., by causing an appropriate vapor reaction to occur, such degradation of the film thickness uniformity can be suppressed, and it becomes possible to control the film thickness uniformity. In particular, by adjusting the temperature of the wafer 200 to 650 degrees C. or less, further, 600 degrees C. or less, the surface reaction becomes dominant relative to the vapor phase reaction. This makes it easy to assure the film thickness uniformity and to control the film thickness uniformity.

Thus, the temperature of the wafer 200 may be set to fall within a range of 250 to 700 degrees C., preferably, 300 to 650 degrees C., more preferably, 350 to 600 degrees C.

By supplying the HCDS gas to the wafer 200 under the aforementioned conditions, a first layer, for example, a Si-containing layer containing Cl having a thickness of less than one atomic layer to several atomic layers is formed on the wafer 200 (a base film including the SiO film of the surface). The Si-containing layer containing Cl may include a Si layer containing Cl, an adsorption layer of HCDS, or both. Also, O contained in the underlying SiO film may be introduced into the first layer. That is, a Si-containing layer containing O and Cl may be formed as the first layer. In the present disclosure, the first layer containing O (the Si-containing layer containing O and Cl) may be referred to simply as a Si-containing layer containing Cl for the convenience of description.

The Si layer containing Cl is a general name which encompasses not only a continuous layer or discontinuous layer formed of Si and containing Cl but also a Si thin film containing Cl obtained by layering such layers. The continuous layer formed of Si and containing Cl may be referred to as a Si thin film containing Cl. Si forming the Si layer containing Cl includes Si whose bond to Cl is completely broken, in addition to Si whose bond to Cl is not completely broken.

The adsorption layer of the HCDS includes not only a continuous adsorption layer formed of HCDS molecules but also a discontinuous adsorption layer thereof. In other words, the adsorption layer of the HCDS includes an adsorption layer having a thickness of one molecular layer formed of HCDS molecules or an adsorption layer having a thickness of less than one molecular layer. The HCDS molecules that form the adsorption layer of the HCDS include molecules in which a bond of Si and Cl or a bond of Si and H is partially broken. That is, the adsorption layer of the HCDS may include a physical adsorption layer of the HCDS, a chemical adsorption layer of the HCDS, or both.

Here, the layer having a thickness of less than one atomic layer means an atomic layer that is discontinuously formed. The layer having a thickness of one atomic layer means an atomic layer that is continuously formed. The layer having a thickness of less than one molecular layer means a molecular layer that is discontinuously formed. The layer having a thickness of one molecular layer means a molecular layer that is continuously formed. The Si-containing layer containing Cl may include both a Si layer containing Cl and an adsorption layer of the HCDS. As described above, the expressions such as "one atomic layer", "several atomic layers", and the like will be used with respect to the Si-containing layer containing Cl.

Under a condition in which the HCDS gas is autolyzed (or pyrolyzed), i.e., a condition in which a pyrolysis reaction of the HCDS gas occurs, Si is deposited on the wafer 200 to form the Si layer containing Cl. Under a condition in which the HCDS gas is not autolyzed (or pyrolyzed), i.e., a condition in which a pyrolysis reaction of the HCDS gas does not occur, the HCDS is adsorbed onto the wafer 200 to form the adsorption layer of the HCDS. From the viewpoint of increasing a deposition rate, when the Si layer containing Cl is formed on the wafer 200, the deposition rate may be greater than that when the adsorption layer of the HCDS gas is formed on the wafer 200.

If the thickness of the first layer formed on the wafer 200 exceeds several atomic layers, a modification action at step 1b to be described later does not affect the entire first layer. In addition, a minimum value of the thickness of the first layer to be formed on the wafer 200 is less than one atomic layer. Accordingly, it is preferred that the thickness of the first layer is set to fall within a range of less than one atomic layer to several atomic layers. By setting the thickness of the first layer to be one atomic layer or less, i.e., one atomic layer or less than one atomic layer, it is possible to relatively increase the modification action at step 1b to be described later and to shorten the time required in the modification reaction at step 1b. It also becomes possible to shorten the time required in forming the first layer at step 1a. As a result, a processing time per cycle can be reduced, and thus, a total processing time can be also reduced. That is to say, the deposition rate can be increased. In addition, by setting the thickness of the first layer to be one atomic layer or less, it becomes possible to improve the controllability of the film thickness uniformity.

After the first layer is formed, the valve 243a is closed to stop the supply of the HCDS gas. At this time, the APC valve 244 is kept opened and the interior of the process chamber 201 is vacuum-exhausted by the vacuum pump 246, whereby the unreacted HCDS gas or the HCDS gas contributed to the formation of the first layer, which remains in the process chamber 201, is removed from the interior of the process chamber 201. At this time, the valves 243c and 243d are kept opened and the supply of the $N_2$ gas into the process chamber 201 is maintained. The $N_2$ gas serves as a purge gas. Thus, the gas remaining in the process chamber 201 can be effectively removed from the process chamber 201.

At this time, the gas remaining in the process chamber 201 may not be completely removed and the interior of the process chamber 201 may not be completely purged. If the gas remaining in the process chamber 201 is small in amount, no adverse effect is generated at step 1b performed thereafter. The flow rate of the $N_2$ gas supplied into the process chamber 201 need not be a large flow rate. For example, by supplying the $N_2$ gas in an amount equal to the volume of the reaction tube 203 (or the process chamber 201), it is possible to perform the purge in such a way that no adverse effect is generated at step 1b. Inasmuch as the interior of the process chamber 201 is not completely purged as mentioned above, it is possible to shorten the purge time and to improve the throughput. It also becomes possible to reduce the consumption of the $N_2$ gas to a minimum necessary level.

As the precursor gas, it may be possible to use not only the HCDS gas but also an inorganic halosilane precursor gas such as, for example, a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane gas, i.e., silicon tetrachloride ($SiCl_4$, abbreviation: STC) gas, or an octachlorotrisilane ($Si_3Cl_8$, abbreviation: OCTS) gas.

In addition, as the precursor gas, it may be possible to use an alkylenehalosilane precursor gas such as an ethylenebis (trichlorosilane) gas, i.e., a 1,2-bis(trichlorosilyl)ethane (($SiCl_3)_2C_2H_4$, abbreviation: BTCSE) gas, or a methylenebis (trichlorosilane) gas, i.e., a bis(trichlorosylil) methane (($SiCl_3)_2CH_2$, abbreviation: BTCSM) gas.

Also, as the precursor gas, it may be possible to use an alkylhalosilane precursor gas such as a 1,1,2,2-tetrachloro-1,2-dimethyldisilane(($CH_3)_2Si_2Cl_4$, abbreviation: TCDMDS) gas, a 1,2-dichloro-1,1,2,2-tetramethyldisilane (($CH_3)_4Si_2Cl_2$, abbreviation: DCTMDS) gas, or a 1-monochloro-1,1,2,2,2-pentamethyldisilane (($CH_3)_5Si_2Cl$, abbreviation: MCPMDS) gas.

Also, as the precursor gas, it may be possible to use an inorganic precursor gas such as a monosilane ($SiH_4$, abbreviation: MS) gas, a disilane ($Si_2H_6$, abbreviation: DS) gas, or a trisilane ($Si_3H_8$, abbreviation: TS) gas.

Also, as the precursor gas, it may be possible to use an aminosilane precursor gas such as, for example, tetrakisdimethylaminosilane ($Si[N(CH_3)_2]_4$, abbreviation: 4DMAS) gas, a trisdimethylamonisilane ($Si[N(CH_3)_2]_3H$, abbreviation: 3DMAS) gas, a bisdiethylaminosilane ($Si[N(C_2H_5)_2]_2H_2$, abbreviation: BDEAS) gas, or a bis tert-butylaminosilane($SiH_2[NH(C_4H_9)]_2$, abbreviation: BTBAS) gas.

As the inert gas, it may be possible to use not only the $N_2$ gas but also a rare gas such as, for example, an Ar gas, a He gas, a Ne gas, or a Xe gas.

[Step 1b]

After step 1a is completed, a TEA gas is supplied to the first layer formed on the wafer 200, i.e., the SiO film, in the process chamber 201.

At this step, the opening/closing control of the valves 243b to 243d are performed in the same manner as the opening/closing control of the valves 243a, 243c, and 243d performed at step 1a. The flow rate of the TEA gas is adjusted by the WC 241b, and the flow rate-adjusted TEA gas is supplied into the process chamber 201 through the nozzle 249b and then exhausted through the exhaust pipe 231. At this time, the TEA gas is supplied to the wafer 200.

The supply flow rate of the TEA gas controlled by the WC 241b is set to fall within a range of, e.g., 100 to 10000 sccm. The internal pressure of the process chamber 201 is set to fall within a range of, e.g., 1 to 5000 Pa, preferably, 1 to 4000 Pa. By setting the internal pressure of the process chamber 201 to such a relatively high pressure, it becomes possible to thermally activate the TEA gas under a non-plasma condition. If the TEA gas is thermally activated and supplied, a relatively more soft reaction can occur, facilitating the formation of a second layer (SiOCN layer) to be described later. A time period during which the TEA gas is supplied to the wafer 200 is set to fall within a range of, e.g., 1 to 200 seconds, preferably, 1 to 120 seconds, more preferably, 1 to 60 seconds. Other process conditions may be the same as, for example, those used at step 1a.

By supplying the TEA gas to the wafer 200 under the aforementioned conditions, it is possible to have the first layer formed on the wafer 200 at step 1a react with the TEA gas. That is, it is possible to have Cl (chloro group) as the halogen element (halogen group) contained in the first layer react with the ligand (ethyl group) contained in the TEA gas. Accordingly, it is possible to extract (separate) at least a portion of Cl contained in the first layer from the first layer and to separate at least a portion of a plurality of ethyl groups contained in the TEA gas from the TEA gas. Then, N of the TEA gas from which at least a portion of the ethyl groups were separated can be bonded to Si contained in the first layer. That is, it becomes possible to bond N having a dangling bond as at least a portion of the ethyl groups were separated, which is N forming the TEA gas, and Si contained in the first layer and having a dangling bond, or Si which has had a dangling bond to form a Si—N bond. At this time, it also becomes possible to bond C contained in the ethyl group (—$CH_2CH_3$) separated from the TEA gas and Si contained in the first layer to form a Si—C bond. As a result, Cl is desorbed from the first layer and the N component is newly introduced into the first layer. Also, at this time, the C component is newly introduced into the first layer.

By supplying the TEA gas under the aforementioned conditions, it becomes possible to have the first layer appropriately react with the TEA gas and to have the aforementioned series of reactions occur. Then, through the series of reactions, Cl is desorbed from the first layer and the N component and the C component are newly introduced into the first layer, whereby the first layer is modified to a silicon oxycarbonitride layer (SiOCN layer) as a layer containing Si, O, C, and N, i.e., a second layer. This layer may be referred to as a SiN layer containing O and C. The second layer becomes a layer having a thickness of less than one atomic layer to several atomic layers. Also, the second layer becomes a layer in which the ratio of the Si component and the ratio of the C component are relatively large, namely, a Si-rich and C-rich layer.

During the formation of the second layer, the Cl contained in the first layer or the H contained in the TEA gas forms a gaseous substance containing at least any one of Cl and H in the curse of the modification reaction of the first layer using the TEA gas and the gaseous substance thus formed is discharged from the interior of the process chamber 201 through the exhaust pipe 231. That is, the impurities such as Cl contained in the first layer are extracted or desorbed from the first layer, and are eventually separated from the first layer. Thus, the second layer becomes a layer having a smaller amount of impurities such as Cl than the first layer.

After the second layer is formed, the valve 243b is closed to stop the supply of the TEA gas. Then, the unreacted TEA gas, the TEA gas contributed to the formation of the second layer, or the reaction byproduct, which remains in the process chamber 201, is removed from the interior of the process chamber 201 by the same processing procedures as used at step 1a. At this time, similar to step 1a, the gas or the like which remains in the process chamber 201 may not be completely removed.

As the amine-based gas, it may be possible to use not only the TEA gas but also an ethylamine-based gas such as a diethylamine (($C_2H_5$)$_2$N)H, abbreviation: DEA) gas or a monoethylamine ($C_2H_5NH_2$, abbreviation: MEA) gas. Also, as the amine-based gas, it may be possible to use a methylamine-based gas such as a trimethylamine (($CH_3$)$_3$N, abbreviation: TMA) gas, a dimethylamine (($CH_3$)$_2$NH, abbreviation: DMA) gas, or a monomethylamine ($CH_3NH_2$, abbreviation: MMA) gas. Also, as the amine-based gas, it may be possible to use a propylamine-based gas such as a tripropylamine (($C_3H_7$)$_3$N, abbreviation: TPA) gas, a dipropylamine (($C_3H_7$)$_2$NH, abbreviation: DPA) gas, or a monopropylamine ($C_3H_7NH_2$, abbreviation: MPA) gas. Also, as the amine-based gas, it may be possible to use an isopropylamine-based gas such as a triisopropylamine ([($CH_3$)$_2$CH]$_3$N, abbreviation: TIPA) gas, a diisopropylamine ([($CH_3$)$_2$CH]$_2$NH, abbreviation: DIPA) gas, or a monoisopropylamine (($CH_3$)$_2$CHNH$_2$, abbreviation: MIPA) gas. Also, as the amine-based gas, it may be possible to use a butylamine-based gas such as tributylamine (($C_4H_9$)$_3$N, abbreviation: TBA) gas, a dibutylamine (($C_4H_9$)$_2$NH, abbreviation: DBA) gas, or a monobutylamine ($C_4H_9NH_2$, abbreviation: MBA) gas. Also, as the amine-based gas, it may be possible to use an isobutylamine-based gas such as a triisobutylamine ([($CH_3$)$_2$CHCH$_2$]$_3$N, abbreviation: TIBA) gas, a diisobutylamine ([($CH_3$)$_2$CHCH$_2$]$_2$NH, abbreviation: DIBA) gas, or a monoisobutylamine (($CH_3$)$_2$CHCH$_2$NH$_2$, abbreviation: MIBA) gas.

That is, as the amine-based gas, it also may possible to preferably use, for example, at least one of the gases of ($C_2H_5$)$_x$NH$_{3-x}$($CH_3$)$_x$NH$_{3-x}$($C_3H_7$)$_x$NH$_{3-x}$[($CH_3$)$_2$CH]$_x$NH$_{3-x}$($C_4H_9$)$_x$NH$_{3-x}$[($CH_3$)$_2$CHCH$_2$]$_x$NH$_{3-x}$ (in the chemical formula, x is an integer of 1 to 3).

Also, as the gas containing C and N instead of the amine-based gas, it may be possible to use a gas containing an organic hydrazine compound, i.e., an organic hydrazine-based gas. As the organic hydrazine-based gas, it may be possible to use a methylhydrazine-based gas such as a monomethylhydrazine (($CH_3$)HN$_2$H$_2$, abbreviation: MMH) gas, a dimethylhydrazine (($CH_3$)$_2$N$_2$H$_2$, abbreviation: DMH) gas, or a trimethylhydrazine (($CH_3$)$_2$N$_2$($CH_3$)H, abbreviation: TMH) gas. Also, as the organic hydrazine-based gas, it may be possible to use an ethylhydrazine-based gas such as an ethylhydrazine (($C_2H_5$)HN$_2$H$_2$, abbreviation: EH) gas.

As the inert gas, it may be possible to use not only the $N_2$ gas but also a rare gas such as, for example, an Ar gas, a He gas, a Ne gas, or a Xe gas.

(Performing Predetermined Number of Times)

By performing a cycle of performing the aforementioned steps 1a and 1b non-simultaneously, i.e., without being synchronized, once or more ($m_1$ times), a SiOCN layer having a predetermined composition and a predetermined thickness may be formed as a seed layer on the wafer 200 (on the SiO film). This layer may be referred to as a SiN layer containing O and C. The seed layer serves as a block layer (diffusion barrier layer) for suppressing spreading of O to the SiN film formed in the first film forming step from the underlying SiO film in the first film forming step described later.

It is preferred that the thickness of the seed layer is set to fall within a range of, e.g., 0.05 nm to 0.3 nm (0.5 Å to 3 Å), preferably, 0.1 nm to 0.2 nm (1 Å to 2 Å).

If the thickness of the seed layer is less than 0.5 Å, the function of the seed layer as the aforementioned block layer may be insufficient to spread the O contained in the underlying SiO film to the SiN film formed in the first film forming step. By setting the thickness of the seed layer to 0.5 Å or greater, it becomes possible to improve the function of the seed layer as the block layer and to avoid the spreading (addition) of O to the SiN film formed in the first film forming step. By setting the thickness of the seed layer to 1 Å or greater, it becomes possible to further improve the function of the seed layer as the block layer and to reliably avoid the spreading of O to the SiN film formed in the first film forming step.

If the thickness of the seed layer exceeds 3 Å, a time period required for forming the seed layer may be increased to degrade the productivity of the substrate processing. In addition, the content of C in the entire layered film of the seed layer and the first film may exceed a predetermined allowable amount. By setting the thickness of the seed layer to 3 Å or less, it becomes possible to shorten a time period required in forming the seed layer, increasing the productivity of the substrate processing. Also, it becomes possible to appropriately reduce the content of C in the entire layered film of the seed layer and the first film. By setting the thickness of the seed layer to 2 Å or less, it becomes possible to further shorten a time period required in forming the seed layer, further increasing the productivity of the substrate processing. Also, it becomes possible to reliably reduce the content of C in the entire layered film of the seed layer and the first film.

Thus, the thickness of the seed layer may be set to fall within a range of, e.g., 0.5 Å to 3 Å, preferably, 1 Å to 2 Å. By setting the number of performing the cycle in the seed layer forming step to fall within a range of, e.g., 5 to 30 times, preferably, 10 to 20 times, it is possible to set the thickness of the seed layer to fall within the aforementioned range. Also, the thickness of the seed layer is within the aforementioned range and is preferably set to be less than that of a first SiN film formed in a first film forming step to be described later. For example, if the thickness of the first SiN film formed in the first film forming step is set to fall within a range of 15 Å to 30 Å, the thickness of the seed layer is preferably set to fall within a range of 0.5 Å to 1 Å.

(First Film Forming Step)

When the formation of the seed layer is completed, steps 2a and 2b as described above are performed.

[Step 2a]

At this step, an HCDS gas is supplied to the seed layer (SiOCN layer) formed on the wafer 200, i.e., the SiO film, in the process chamber 201. The processing procedures and processing conditions of this step may be the same as those of step 1a.

By performing step 2a, a Si-containing layer containing Cl which does not contain O is formed as a third layer on the seed layer. The reason why the third layer does not contain O is because the seed layer serves as the block layer for suppressing the spreading of O from the underlying SiO film as mentioned above.

[Step 2b]

After step 2a is completed, a $NH_3$ gas is supplied to a third layer formed on the wafer 200, i.e., the seed layer, in the process chamber 201.

At this step, the opening/closing control of the valves 243b to 243d are performed in the same manner as the opening/closing control of the valves 243a, 243c, and 243d performed at step 1a. The flow rate of the $NH_3$ gas is adjusted by the MFC 241b, and the flow rate-adjusted $NH_3$ gas is supplied into the process chamber 201 through the nozzle 249b and then exhausted through the exhaust pipe 231. At this time, the $NH_3$ gas is supplied to the wafer 200.

The supply flow rate of the $NH_3$ gas controlled by the MFC 241b is set to fall within a range of, e.g., 100 to 10000 sccm. The internal pressure of the process chamber 201 is set to fall within a range of, e.g., 1 to 4000 Pa, preferably, 1 to 3000 Pa. By setting the internal pressure of the process chamber 201 to such a relatively high pressure, it becomes possible to thermally activate the $NH_3$ gas under a non-plasma condition. If the $NH_3$ gas is thermally activated and supplied, a relatively more soft reaction can occur, facilitating the formation of a fourth layer (SiN layer) to be described later. A time period during which the $NH_3$ gas is supplied to the wafer 200 is set to fall within a range of, e.g., 1 to 120 seconds, preferably, 1 to 60 seconds. Other process conditions may be the same as, for example, those used at step 1a.

By supplying the $NH_3$ gas to the wafer 200 under the aforementioned conditions, at least a portion of the third layer is nitrided (modified). As the third layer is modified, a fourth layer, i.e., a silicon nitride layer (SiN layer) which contains Si and N and does not contain O, is formed on the wafer 200, i.e., the seed layer. During the formation of the fourth layer, the impurities such as Cl contained in the third layer form a gaseous substance containing at least Cl in the curse of the modification reaction using the $NH_3$ gas and the gaseous substance thus formed is discharged from the interior of the process chamber 201. That is, the impurities such as Cl contained in the third layer are extracted or desorbed from the third layer, and are eventually separated from the third layer. Thus, the fourth layer becomes a layer which is smaller in the amount of impurities such as Cl than the third layer.

After the fourth layer is formed, the valve 243b is closed to stop the supply of the $NH_3$ gas. Then, the unreacted $NH_3$ gas, the $NH_3$ gas contributed to the formation of the fourth layer, or the reaction byproduct, which remains in the process chamber 201, is removed from the interior of the process chamber 201 by the same processing procedures as used at step 1a. At this time, similar to step 1a, the gas or the like which remains in the process chamber 201 may not be completely removed.

As the N-containing gas, it may be possible to use not only the $NH_3$ gas but also a hydrogen nitride-based gas such as, for example, a diagen ($N_2H_2$) gas, a hydrazine ($N_2H_4$) gas, or a $N_3H_8$ gas, a gas containing a compound thereof, or the like. As the inert gas, it may be possible to use not only the $N_2$ gas but also a rare gas such as, for example, an Ar gas, a He gas, a Ne gas, or a Xe gas.

(Performing Predetermined Number of Times)

Figure 8A:
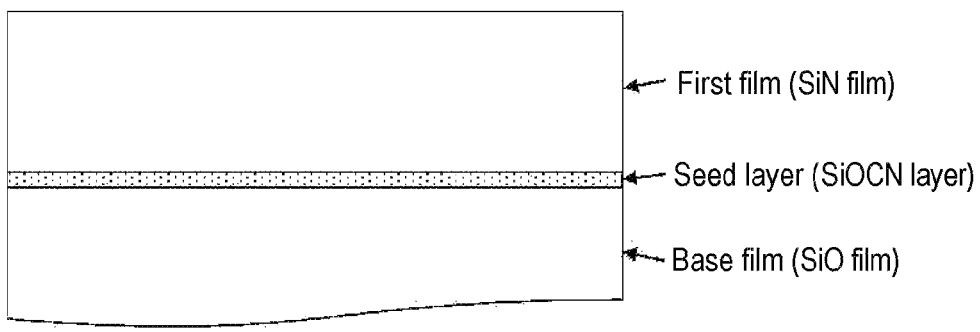
FIG. 8A is a diagram illustrating a cross-sectional structure of a protective film.

By performing the cycle of performing the steps 2a and 2b non-synchronously, i.e., without being synchronized, two or more ($n_1$) times, it is possible to form a silicon nitride film not containing O (SiN film not containing O), i.e., a first SiN film, having a predetermined composition and a predetermined film thickness on the wafer 200 (on the seed layer). The SiN film not containing O has an etch resistance higher than that of a SiN film that contains O. Thus, the first SiN film serves as a protective film for protecting the underlying SiO film in an etching process described later. It may be considered that the seed layer is included in the protective film. That is, the layered film of the seed layer and the first SiN film may be considered as the protective film. A cross-sectional structure of the protective film formed by the film forming sequence illustrated in FIG. 4 is illustrated in FIG. 8A.

A film thickness of the first SiN film is preferably greater than that of the seed layer. The film thickness of the first SiN film is set to fall within a range of, e.g., 0.2 nm to 10 nm (2 Å to 100 Å), preferably, 0.5 nm to 10 nm (5 Å to 100 Å), more preferably, 1 nm to 10 nm (10 Å to 100 Å). Thus, the number of times ($n_1$ times) of performing the cycle at this step is set to be greater than the number of times ($m_1$ times) of performing the cycle in the seed layer forming step described above ($n_1 > m_1$).

If the film thickness of the first SiN film is less than 2 Å, the first SiN film may not serve as the protective film. By setting the film thickness of the first SiN film to 2 Å or greater, the first SiN film can serve as the protective film. By setting the film thickness of the first SiN film to 5 Å or greater, the first SiN film can sufficiently serve as the protective film. In addition, by setting the film thickness of the first SiN film to 10 Å or greater, it is possible to further enhance the function of the first SiN film as the protective film, whereby the first SiN film can reliably serve as the protective film.

In addition, if the film thickness of the first SiN film exceeds 100 Å, the technical meaning of forming the first SiN film on the seed layer may be reduced. That is, if the film thickness exceeds 100 Å, even when the first SiN film is formed without forming the seed layer in advance, the first SiN film can sufficiently serve as the protective film alone. This is because, if the film thickness of the first SiN film exceeds 100 Å, the influence of a pin hole of the film becomes sufficiently small.

Here, the term "pin hole" refers to a path along which an etchant such as an etching gas or an etching solution infiltrates toward a base side of the film, i.e., the SiO film side in this embodiment, when the etchant is supplied to the film. The pin hole is not limited to a case of being formed as a physical hole. For example, the pin hole may be formed due to various factors such as a local crack, a degradation of a local film density, an increase in a local defect density, or a change in a local composition or a crystal structure, which may occur in a film. With the pin hole present in the protective film, when an etchant is supplied to the protective film, the etchant may reach the base film through the pin hole to damage the base film. In addition, the etchant may infiltrate into the pin hole to cause the protective film itself to be etched to result in a degradation of the function as the protective film.

According to extensive research of the present inventors, it was confirmed that, when the protective film is intended to be formed of a SiN film not containing O, if the film thickness thereof is small, it is easy to generate a pin hole. The present inventors confirmed that, when the protective film is intended to be formed of the SiN film not containing O, if the film thickness thereof is 100 Å or less, there may occur the influence of the pin hole, and if the film thickness is 30 Å or less, the influence of the pin hole is increased to make the function of the SiN film as the protective film insufficient. It is considered that this is because the O contained in the underlying oxide film spreads to the protective film to form a degradation layer near an interface between the SiN film and the oxide film in the protective film or the O spreads to the entire protective films. In contrast, by forming the protective film as the layered film of the seed layer and the SiN film not containing O, even though the film thickness is 100 Å or less, it becomes possible to suppress the generation of the pin hole to enhance the function of the protective film. The present inventors confirmed that, if the protective film is formed as the layered film of the seed layer and the SiN film not containing O, even though the film thickness of the SiN film not containing O is 100 Å or less, or 30 Å or less, the SiN film can sufficiently serve as the protective film. In this regard, it may be considered that forming the protective film as the layered film of the seed layer and the SiN film not containing O is meaningful particularly if the SiN film not containing O is required to have a thin film having a film thickness of 100 Å or less.

From the above, it is preferred that the film thickness of the first SiN film is set to fall within a range of 2 Å to 100 Å, preferably, 5 Å to 100 Å, more preferably, 10 Å to 100 Å. In addition, it was confirmed that, even though the film thickness of the first SiN film is set to fall within a range of 2 Å to 30 Å, preferably, 5 Å to 30 Å, more preferably, 10 Å to 30 Å, the generation of the pin hole can be suppressed, and thus, the first SiN film can sufficiently serve as the protective film.

Further, it is preferred that the aforementioned cycle is repeated a plural number of times. That is, it is preferred that the thickness of the fourth layer (SiN layer) formed per cycle is set to be smaller than a desired film thickness and the aforementioned cycle is repeated a plural number of times until the desired film thickness is obtained.

(Purge Step and Atmosphere Returning Step)

After the formation of the SiN film is completed, an $N_2$ gas is supplied into the process chamber 201 from each of the gas supply pipes 232*c* and 232*d* and then exhausted through the exhaust pipe 231. The $N_2$ gas serves as a purge gas. Thus, the interior of the process chamber 201 is purged and the residual gas or the reaction byproduct remaining in the process chamber 201 is removed from the interior of the process chamber 201 (purge). Thereafter, the internal atmosphere of the process chamber 201 is substituted with an inert gas (inert gas substitution), and the internal pressure of the process chamber 201 returns to a normal pressure (return to an atmospheric pressure).

(Unloading Step)

Thereafter, the seal cap 219 is moved down by the boat elevator 115 to open the lower end of the manifold 209. The processed wafer 200 supported by the boat 217 is unloaded from the lower end of the manifold 209 to the outside of the reaction tube 203 (boat unloading). After the boat 217 is unloaded, the shutter 219*s* is moved and the lower end opening of the manifold 209 is sealed by the shutter 219*s* through the O-ring 220*c* (shutter close). The processed wafer 200 is unloaded to the outside of the reaction tube 203 and then discharged from the boat 217 (wafer discharge).

(3) Etching Process

After the wafer 200 is unloaded from the interior of the process chamber 201, a further film forming process, a resist pattern forming process, and the like are performed on the wafer 200 which has been film forming processed. Then, the wafer 200 after these processes are performed is loaded into a reaction chamber (second process chamber) included in an etching device serving as a second substrate processing part. Then, in a state where the interior of the reaction chamber is controlled to have a predetermined process pressure and a process temperature, an etching gas is supplied as an etchant to the wafer 200 in the reaction chamber to perform an etching process on the film or the like formed on the surface of the wafer 200. At this time, the SiN film not containing O formed on the wafer 200 serves as the protective film for protecting the underlying SiO film. In this embodiment, a series of steps including the etching process, which is a step performed after the first film forming step, are referred to as a "different step".

As the etching gas, it may be possible to use, for example, a hydrogen fluoride (HF) gas diluted with the $N_2$ gas, or the like. Processing conditions of the etching process are as follows:

Flow rate of the HF gas: 100 to 2000 sccm, preferably, 1000 to 2000 sccm

Flow rate of the $N_2$ gas: 1000 to 8000 sccm, preferably, 7000 to 8000 sccm

Internal pressure of the reaction chamber: 133 to 26600 Pa, preferably, 13300 to 26600 Pa Internal temperature of the reaction chamber: 50 to 100 degrees C., preferably, 50 to 75 degrees C.

Process time: 0.5 to 10 min., preferably, 0.5 to 1 min.

After the lapse of a predetermined period of time has lapsed since the HF gas started to be supplied, when the etching process on the wafer 200 is completed, the supply of the HF gas into the reaction chamber is stopped and the interior of the reaction chamber is exhausted. Thereafter, after the internal atmosphere of the reaction chamber is substituted with an inert gas and the internal pressure of the reaction chamber is returned to a normal pressure, the etched wafer 200 is unloaded from the interior of the reaction chamber.

As the etchant, it may be possible to use not only the HF gas but also a fluoride-based gas such as, for example, a fluoride (F2) gas, or a chloride-based gas such as a hydrogen chloride (HCl) gas. The processing conditions of these cases may be the same as the aforementioned processing conditions. However, it is preferred that the internal temperature of the reaction chamber is set to fall within a range of about 100 to 500 degrees C. Also, these gases may be mixed to be used, an H-containing gas (reductive gas) such as an $H_2$ gas may be added to these gases so as to be used, or these gases may be activated by plasma so as to be used. Also, as the etchant, it may be possible to use an etching solution such as, for example, an HF aqueous solution or an HCl aqueous solution, rather than a gas.

(4) Effects According to the Present Embodiment

According to the present embodiment, one or more effects set forth below may be achieved.

(a) By forming the seed layer as a base film of the protective film (SiN film) in advance, and making the seed layer serve as a block layer for suppressing the spreading of O from the SiO film to the SiN film, it becomes possible to suppress the addition of O to the SiN film formed on the seed layer. Thus, it is possible to enhance the film characteristics of the SiN film formed on the seed layer.

That is, by forming the protective film as the SiN film not containing O, even when the protective film is thinned, it becomes possible to form the protective film as a film without a pin hole, i.e., a pin hole-free film. Accordingly, even when the protective film is thinned, it becomes possible to avoid an etching damage to the base film entailed by the etching process. In addition, by forming the protective film as the pin hole-free film, it becomes possible to suppress the etching of the protective film itself entailed by the etching process and to avoid a degradation of the function of the first SiN film as the protective film.

Furthermore, by forming the protective film by the SiN film not containing O, it is possible to form the film as a film having a high tolerance (etch resistance) to the etchant such as HF or the like. Thus, it becomes possible to enhance the function thereof as the protective film. Moreover, it becomes possible to suppress the etching of the protective film itself entailed by the etching process, thus maintaining the function thereof as the protective film.

(b) By containing C in the seed layer, it becomes possible to increase the effect of suppressing the spreading of O by the seed layer, compared with a case where the seed layer is formed by a SiON layer not containing C. Accordingly, it become possible to more reliably suppress the spreading of O to the SiN film formed on the seed layer, thus more reliably achieving the aforementioned effect.

(c) By containing C in the seed layer, it becomes possible to increase the etch resistance of the seed layer, compared with the case where the seed layer is formed by the SiON layer that not containing C. Thus, it becomes possible to more reliably protect the SiO film as a base film.

(d) By forming the seed layer on the wafer 200 in advance, it becomes possible to shorten an incubation time of the SiN film formed thereon. In addition, by forming the seed layer as a continuous layer, it becomes possible to uniformly align the timing of starting the growth of the SiN film over the entire in-plane region of the wafer 200. Thus, it becomes possible to increase the step coatability or in-plane film thickness uniformity of the SiN film and to enhance the function thereof as the protective film.

(e) In the first film forming step, by non-simultaneously performing the supply of the HCDS gas to the wafer 200 and the supply of the $NH_3$ gas to the wafer 200, it becomes possible to enhance the step coatability or film thickness controllability of the SiN film, compared with a case where the supply of these gases is simultaneously performed. As a result, it becomes possible to enhance the function of the SiN film as the protective film.

(f) The aforementioned effects may be similarly achieved in a case where a precursor gas other than the HCDS gas is used, in a case where a gas that contains C and N other than the TEA gas is used, or in a case where an N-containing gas other than the $NH_3$ gas is used. Moreover, the aforementioned effects may be similarly achieved in a case where an etchant other than the HF gas is used as the etching gas.

(5) Modifications

The sequence of the film forming process in the present embodiment is not limited to the example illustrated in FIG. 4 but may be changed as in modifications described below.

(Modification 1)

In the seed layer forming step, a cycle of non-simultaneously performing a step of supplying, for example, an HCDS gas as a precursor gas to the wafer 200, a step of supplying, for example, a $C_3H_6$ gas as a C-containing gas to the wafer 200, and a step of supplying, for example, a $NH_3$ gas as an N-containing gas to the wafer 200 may be performed a predetermined number of times ($m_1$ times). Also in this case, the underlying SiO film may be used as an oxygen source, and a SiOCN layer may be formed as a seed layer on the SiO film. The film forming sequence of this modification may be expressed as follows:

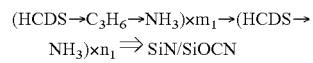

In the step of supplying the $C_3H_6$ gas, the supply flow rate of the $C_3H_6$ gas controlled by the WC 241b is set to fall within a range of, e.g., 100 to 10000 sccm. The internal pressure of the process chamber 201 is set to fall within a range of, e.g., 1 to 5000 Pa, preferably, 1 to 4000 Pa. The time period during which the $C_3H_6$ gas is supplied to the wafer 200 is be set to fall within a range of, e.g., 1 to 200 seconds, preferably, 1 to 120 seconds, more preferably, 1 to 60 seconds. Other processing conditions may be the same as, for example, those of step 1a in the film forming sequence illustrated in FIG. 4.

The processing procedures or processing conditions of step of supplying the HCDS gas and step of supplying the $NH_3$ gas may be the same as those of steps 1a and 2b in the film forming sequence of FIG. 4.

Also in this modification, the same effects as those of the film forming sequence illustrated in FIG. 4 may be achieved. That is, it becomes possible to make the seed layer formed on the SiO film serve as a block layer for suppressing the spreading of O from the SiO film. Thus, it becomes possible to form the first film formed on the seed layer as a SiN film not containing O, i.e., a film having an etch resistance higher than that of the SiON film. As a result, it becomes possible to enhance the function of the first film as the protective film.

(Modification 2)

At the seed layer forming step, a cycle of non-simultaneously performing a step of supplying, for example, a TCDMDS gas or a BTCSM gas as a precursor gas containing C to the wafer 200, and a step of supplying, for example, a NH$_3$ gas as an N-containing gas to the wafer 200 may be performed a predetermined number of times (m$_1$ times). Also in this case, the underlying SiO film may be used as an oxygen source, and a SiOCN layer may be formed as a seed layer on the SiO film. The film forming sequence of this modification may be expressed as follows:

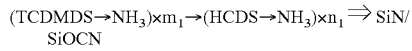
(TCDMDS→NH$_3$)×m$_1$→(HCDS→NH$_3$)×n$_1$ ⇒ SiN/SiOCN

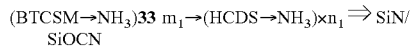
(BTCSM→NH$_3$)33 m$_1$→(HCDS→NH$_3$)×n$_1$ ⇒ SiN/SiOCN

The processing procedures or processing conditions of the step of supplying the precursor gas containing C such as the TCDMDS gas and the step of supplying the NH$_3$ gas may be the same as those of steps 1a and 2b in the film forming sequence of FIG. 4.

Also in this modification, the same effects as those of the film forming sequence illustrated in FIG. 4 may be achieved. That is, it becomes possible to make the seed layer formed on the SiO film serve as a block layer for suppressing the spreading of O from the SiO film. Thus, it is possible to form the first film formed on the seed layer as a SiN film not containing O, i.e., a film having an etch resistance higher than that of the SiON film. As a result, it becomes possible to enhance the function of the first film as the protective film.

(Modification 3)

Figure 5:
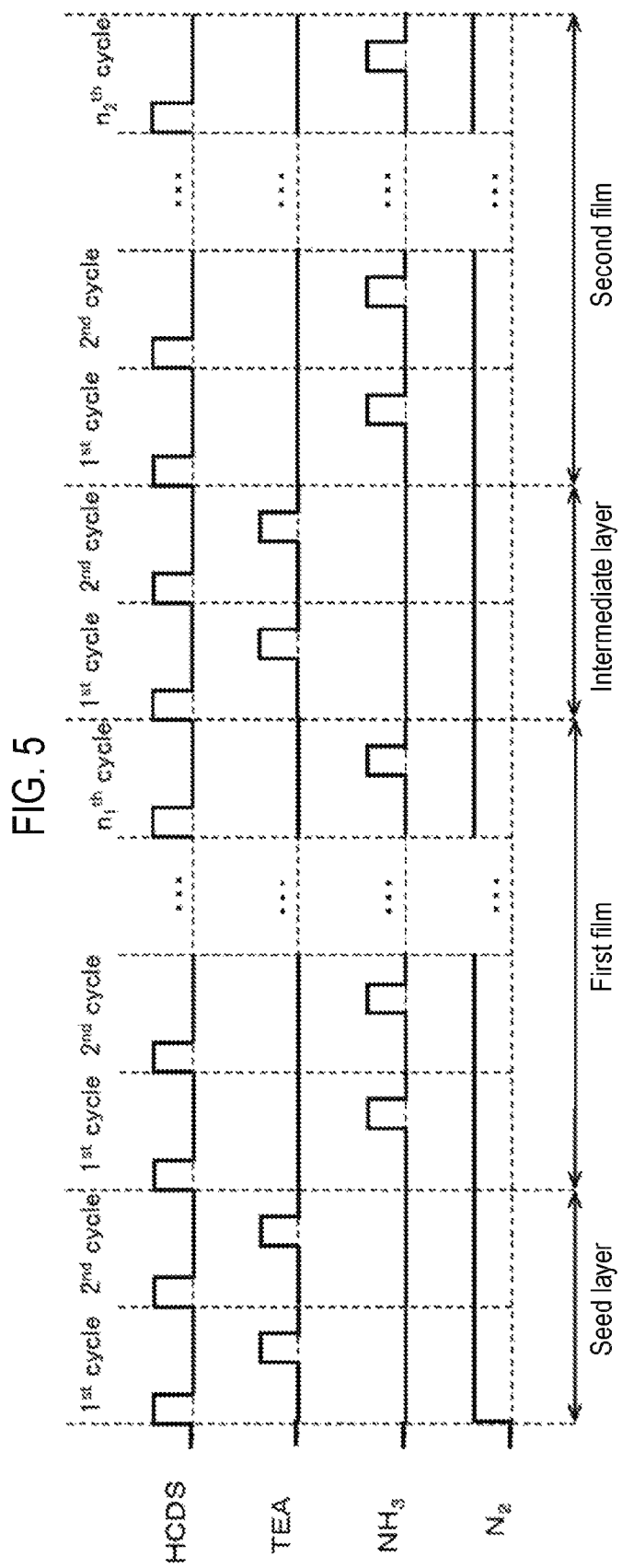
FIG. 5 is a diagram illustrating an exemplary modification to the timing of the gas supply in a film forming sequence according to one embodiment of the present disclosure.

As in the film forming sequence illustrated in FIG. 5, after the seed layer (SiOCN layer) and the first film (first SiN film) are formed, a step (intermediate layer forming step) of forming an intermediate layer on the first film and a step (second film forming step) of forming a second film on the intermediate layer may be performed.

The processing procedures and processing conditions of the intermediate layer forming step may be the same as those of the film forming sequence illustrated in FIG. 4 or those of the seed layer forming step of modifications 1 and 2. However, in the intermediate layer forming step, the underlying first SiN film of the intermediate layer does not serve as an oxygen source. Thus, the intermediate layer becomes a SiCN layer not containing O.

The processing procedures and processing conditions of the second film forming step may be the same as those of the first forming step in FIG. 4. The second film formed in the second film forming step becomes a SiN film (second SiN film) not containing O and C. The film thickness of the second SiN film is set to a thickness to be consumed (dissipated) through, for example, a step performed after the second film forming step, which is a different step including the aforementioned etching process.

When the number of performing the cycle in the intermediate layer forming step is m$_2$ times and the number of performing the cycle in the second film forming step is n$_2$ times, the film forming sequence of this modification may be expressed as follows. Further, the film forming sequence illustrated in FIG. 5 represents an example in which the number of performing the cycle in the seed layer forming step and the intermediate layer forming step are two times, respectively (m$_1$=2 and m$_2$=2).

Figure 8B:
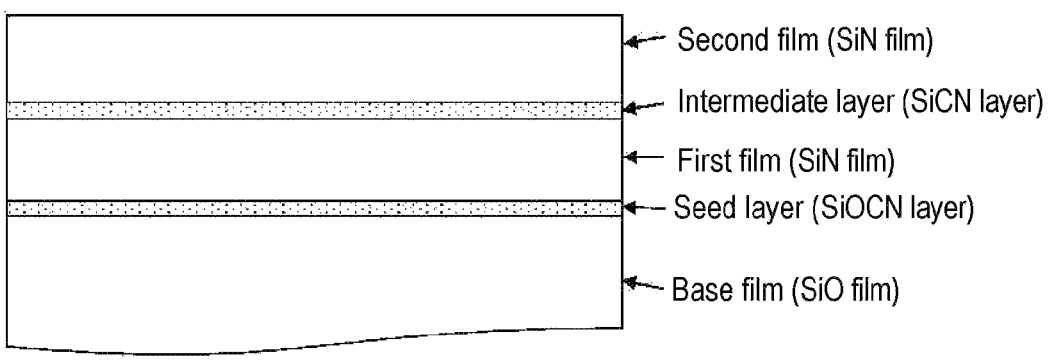
FIG. 8B is a diagram illustrating an exemplary modification in the cross-sectional structure of the protective film.

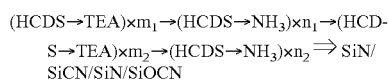
(HCDS→TEA)×m$_1$→(HCDS→NH$_3$)×n$_1$→(HCDS→TEA)×m$_2$→(HCDS→NH$_3$)×n$_2$ ⇒ SiN/SiCN/SiN/SiOCN A cross-sectional structure of the protective film formed by the film forming sequence of this modification is illustrated in FIG. 8B. The protective film for protecting the underlying SiO film is formed by the layered film of the first film, the intermediate layer, and the second film formed on the seed layer. It may be considered that the seed layer is included in the protective film. In other words, the seed layer and the layered film of the first film, the intermediate layer, and the second film may be considered as the protective film.

Also in this modification, the same effects as those of the film forming sequence of FIG. 4 may be achieved. That is, it becomes possible to make the seed layer formed on the SiO film serve as a block layer for suppressing the spreading of O from the SiO film. Thus, it becomes possible to prevent the spreading of O to the films or layers formed on the seed layer and to enhance the function of the layered film formed on the seed layer as the protective film.

In addition, according to this modification, by forming the SiCN layer as the intermediate layer between the first film and the second film, it becomes possible to enhance the function of the layered film formed on the seed layer as the protective film, compared with a case where the intermediate layer is not installed. The reason is because the Si—C bond has a bonding force stronger than that of a Si—N bond. Thus, by forming the intermediate layer as the SiCN layer by adding C to the intermediate layer, it becomes possible to make the etch resistance of the SiCN layer higher than that of the SiN film not containing C, i.e., the first film or the second film. By forming the intermediate layer by the SiCN layer having a high etch resistance while setting the film thickness of the second film as a thickness to be consumed through a different step including the etching process, which is a step performed after the second film forming step, it becomes possible for the intermediate layer to remain without being consumed though the different step. As a result, in a step performed after the aforementioned different step, it becomes possible to make an outermost surface of the wafer 200 as the intermediate layer. That is, after the aforementioned different step, when another step requiring an etch resistance is performed, it becomes possible to protect the surface of the first film by the intermediate layer having an etch resistance higher than that of the first film. Thus, it becomes possible to reliably protect the underlying SiO film.

Further, it is preferred that the thickness of the intermediate layer is set to fall within a range of, e.g., 0.05 nm to 0.3 nm (0.5 Å to 3 Å), preferably, 0.1 nm to 0.2 nm (1 Å to 2 Å).

If the thickness of the intermediate layer is less than 0.5 Å, the etch resistance of the intermediate layer may be lowered to have a difficulty in protecting the surface of the first film by the intermediate layer when another step requiring the etch resistance is performed. By setting the thickness of the intermediate layer to be equal to or greater than 0.5 Å, it becomes possible to increase the etch resistance of the intermediate layer, thus protecting the surface of the first film by the intermediate layer when another step requiring the etch resistance is performed. By setting the thickness of the intermediate layer to be equal to or greater than 1 Å, bit becomes possible to increase the etch resistance of the intermediate layer, thus reliably protecting the surface of the first film by the intermediate layer when another step requiring etch resistance is performed.

If the thickness of the intermediate layer exceeds 3 Å, the time required for forming the intermediate layer may be increased to degrade the productivity of the substrate processing. In addition, the content of C in the entire protective film including the intermediate layer may exceed a predetermined allowable amount. By setting the thickness of the intermediate layer to be 3 Å or less, it become possible to shorten the time required in forming the intermediate layer to increase the productivity of the substrate processing. In addition, it becomes possible to suitably suppress the content of C in the entire protective film including the intermediate layer. By setting the thickness of the intermediate layer to be 2 Å or less, it become possible to further shorten the time required in forming the intermediate layer to increase the productivity of the substrate processing. Also, it becomes possible to reliably suppress the content of C in the entire protective film including the intermediate layer.

(Modification 4)

Figure 6:
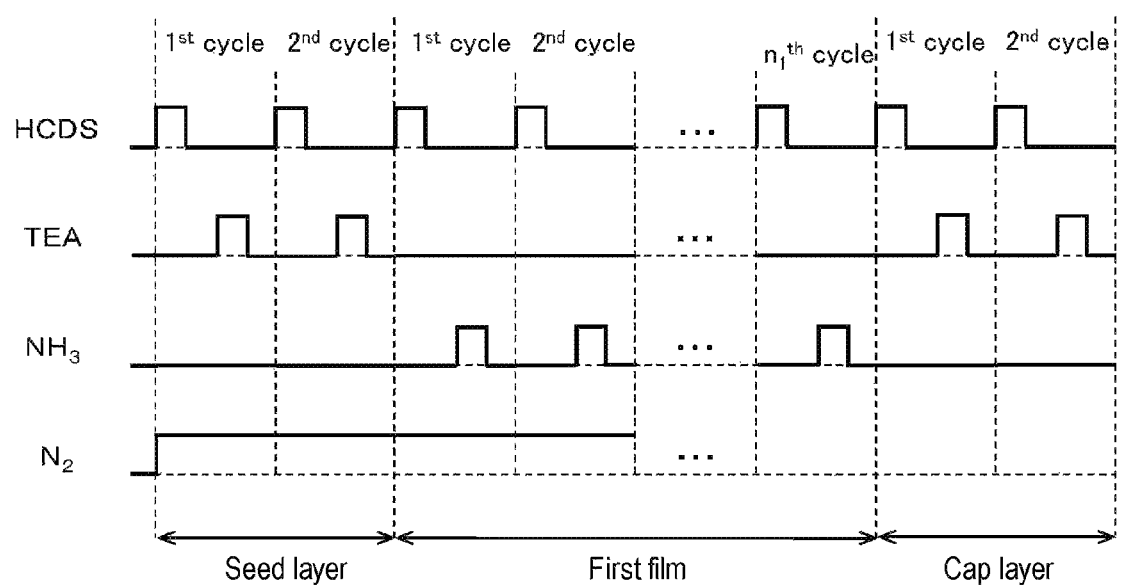
FIG. 6 is a diagram illustrating an exemplary modification to the timing of the gas supply in a film forming sequence according to one embodiment of the present disclosure.

As in the film forming sequence illustrated in FIG. 6, after the seed layer (SiOCN layer) and the first film (first SiN film) are formed, a step (cap layer forming step) of forming a cap layer on the first film may be performed.

The processing procedures and processing conditions of the cap layer forming step may be the same as those of the film forming sequence illustrated in FIG. 4 or those of the seed layer forming step of modifications 1 and 2. However, in the cap layer forming step, the underlying first SiN film of the cap layer does not serve as an oxygen source. Thus, the cap layer becomes a SiCN layer not containing O at least immediately after the formation thereof.

When the number of performing the cycle in the cap layer forming step is $m_3$ times, the film forming sequence of this modification may be expressed as follows. Also, the film forming sequence illustrated in FIG. 6 represents an example in which the number of performing the cycle in the seed layer forming step and the cap layer forming step are two times, respectively ($m_1=2$ and $m_3=2$).

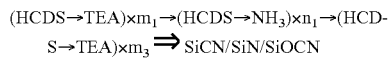

$$(HCDS \rightarrow TEA) \times m_1 \rightarrow (HCDS \rightarrow NH_3) \times n_1 \rightarrow (HCDS \rightarrow TEA) \times m_3 \Rightarrow SiCN/SiN/SiOCN$$

Figure 8C:
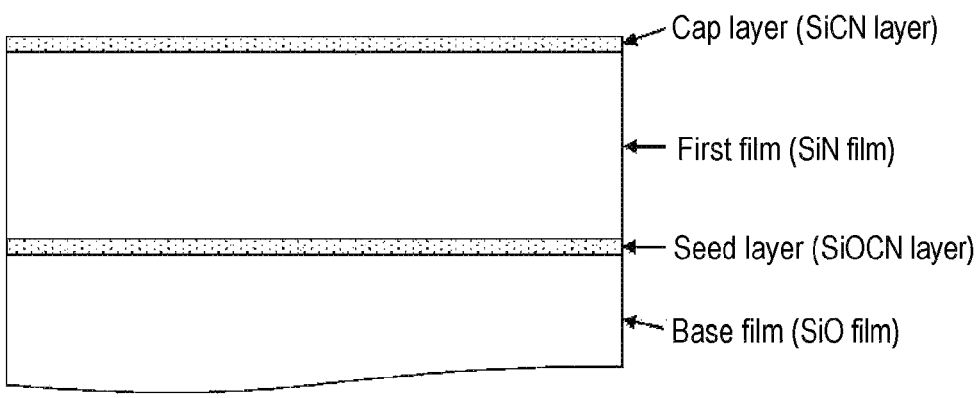
FIG. 8C is a diagram illustrating an exemplary modification in the cross-sectional structure of the protective film.

A cross-sectional structure of the film formed on the wafer 200 by the film forming sequence of this modification is illustrated in FIG. 8C. The protective film for protecting the underlying SiO film is formed by the layered film of the first film and the cap layer formed on the seed layer. It may be considered that the seed layer is included in the protective film. In other words, the seed layer and the layered film of the first film and the cap layer may be considered as the protective film.

Also in this modification, the same effects as those of the film forming sequence of FIG. 4 may be achieved. That is, it becomes possible to make the seed layer formed on the SiO film serve as a block layer for suppressing the spreading of O from the SiO film. Thus, it becomes possible to prevent the spreading of O to the films or layers formed on the seed layer and to enhance the function of the layered film formed on the seed layer as the protective film. Further, according to this modification, by forming the SiCN layer having an etch resistance higher than that of the first film as the cap layer on the first film, it becomes possible to further enhance the function of the layered film formed on the seed layer as the protective film.

Figure 9A:
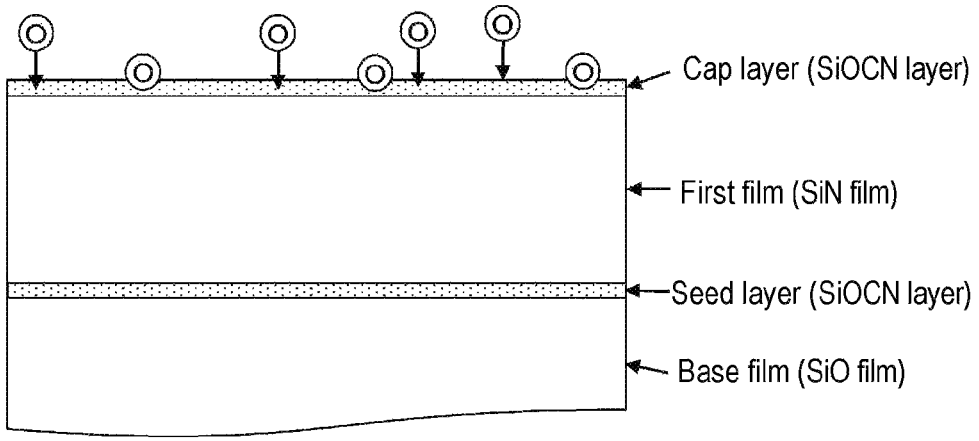
FIG. 9A is a diagram illustrating a change of the state when the surface of the protective film is exposed to the atmosphere.

In addition, as illustrated in FIG. 9A, by transferring the wafer 200 with the cap layer formed thereon into the atmosphere (exposing the wafer 200 to the atmosphere), it is possible to modify at least a portion of the cap layer into a SiOCN layer by introducing O contained in the atmosphere into the cap layer. In this manner, it is possible to suitably adjust (lower) the etch resistance of the cap layer, for example, it becomes possible to control the etch resistance of the cap layer to have an appropriate strength lower than the etch resistance of the SiCN layer and higher than etch resistance of the first film. This processing may be performed in a state where the temperature of the wafer 200 is set to be lower than that of the wafer 200 in the cap layer forming step, for example, to fall within a range of a room temperature (25 degrees C.) to 100 degrees C., preferably, a room temperature to 60 degrees C. In addition, once the SiOCN layer is formed as the cap layer on the first SiN film, even though the wafer 200 continues to be exposed to the atmosphere, it becomes possible to suppress the spreading of O to the first SiN film. This is because, the cap layer (SiOCN layer) serves as a block layer (spreading barrier layer) for suppressing the spreading of O from the atmosphere to the first SiN film.

Also, it is preferred that the thickness of the cap layer is set to fall within a range of, e.g., 0.05 nm to 0.3 nm (0.5 Å to 3 Å), preferably, 0.1 nm to 0.2 nm (1 Å to 2 Å).

If the thickness of the cap layer is less than 0.5 Å, the aforementioned protection function of the first film provided in the cap layer may be lowered to have a difficulty in protecting the surface of the first film by the cap layer. By setting the thickness of the cap layer to be equal to or greater than 0.5 Å, it becomes possible to increase the protection function of the first film provided in the cap layer, thus protecting the surface of the first film by the cap layer. By setting the thickness of the cap layer to be equal to or greater than 1 Å, it becomes possible to further increase the protection function of the first film provided in the cap layer, thus reliably protecting the surface of the first film by the cap layer.

If the thickness of the cap layer exceeds 3 Å, the time required for forming the cap layer may be increased to degrade the productivity of the substrate processing. In addition, the content of C in the entire protective film including the cap layer may exceed a predetermined allowable amount. By setting the thickness of the cap layer to be 3 Å or less, it become possible to shorten the time required in forming the cap layer to increase the productivity of the substrate processing. Also, it becomes possible to suitably suppress the content of C in the entire protective film including the cap layer. By setting the thickness of the cap layer to be 2 Å or less, it become possible to further shorten the time required in forming the cap layer to further increase the productivity of the substrate processing. Also, it becomes possible to reliably suppress the content of C in the entire protective film including the cap layer.

(Modification 5)

The cap layer may be formed by a method other than that of modification 4. For example, after the first film forming step is performed, the temperature of the wafer 200 may be set to be higher than that of the wafer 200 in the first film forming step and the wafer 200 with the first SiN film formed thereon may be transferred into the atmosphere. Thus, it becomes possible to introduce O and C included in the atmosphere to the surface of the first SiN film. As a result, at least a portion of the surface of the first SiN film can be modified to a SiOCN layer having an etch resistance higher than that of the first SiN film so as to serve as the cap layer.

Further, the process of forming the cap layer may be performed by heating the wafer 200 with the first SiN film formed thereon at a temperature higher than that of the wafer 200 in the first film forming step for a predetermined period of time under a C-containing gas atmosphere such as a $C_3H_6$ gas or a TEA gas. In this case, it becomes possible to introduce C to the surface of the first SiN film. As a result, at least a portion of the surface of the first SiN film may be modified to a SiCN layer having an etch resistance higher than that of the first SiN film so as to serve as the cap layer. Also, after the surface of the first SiN film is modified to the SiCN layer, the wafer 200 heated to have a temperature equal to or higher than that of the wafer 200 in the first film forming step may be exposed to the atmosphere to introduce O and C contained in the atmosphere to the SiCN layer to modify the SiCN layer to a SiOCN layer. This processing may be performed by setting the temperature of the wafer 200 to be equal to or higher than that of the wafer 200 in the first film forming step, for example, to fall within a range of 550 to 800 degrees C., preferably, 600 to 700 degrees C.

Figure 9B:
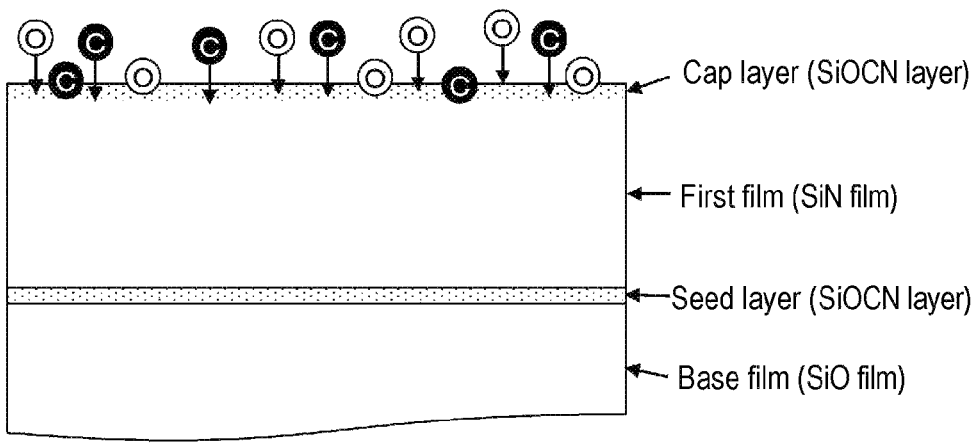
FIG. 9B is a diagram illustrating a change of the state when the surface of the protective film is exposed to the atmosphere in a high temperature state.

A cross-sectional structure of the protective film formed by the film forming sequence of this modification is illustrated in FIG. 9B. The protective film for protecting the underlying SiO film is formed by the first film whose surface is modified to the cap layer. It may be considered that the seed layer is included in the protective film.

Also in this modification, the same effects as those of modification 4 may be achieved. In addition, in this modification, since the cap layer is formed by modifying the surface of the first film, it becomes possible to simplify the control of the film forming process, compared with a case where the cap layer is deposited on the first film.

(Modification 6)

Figure 7:
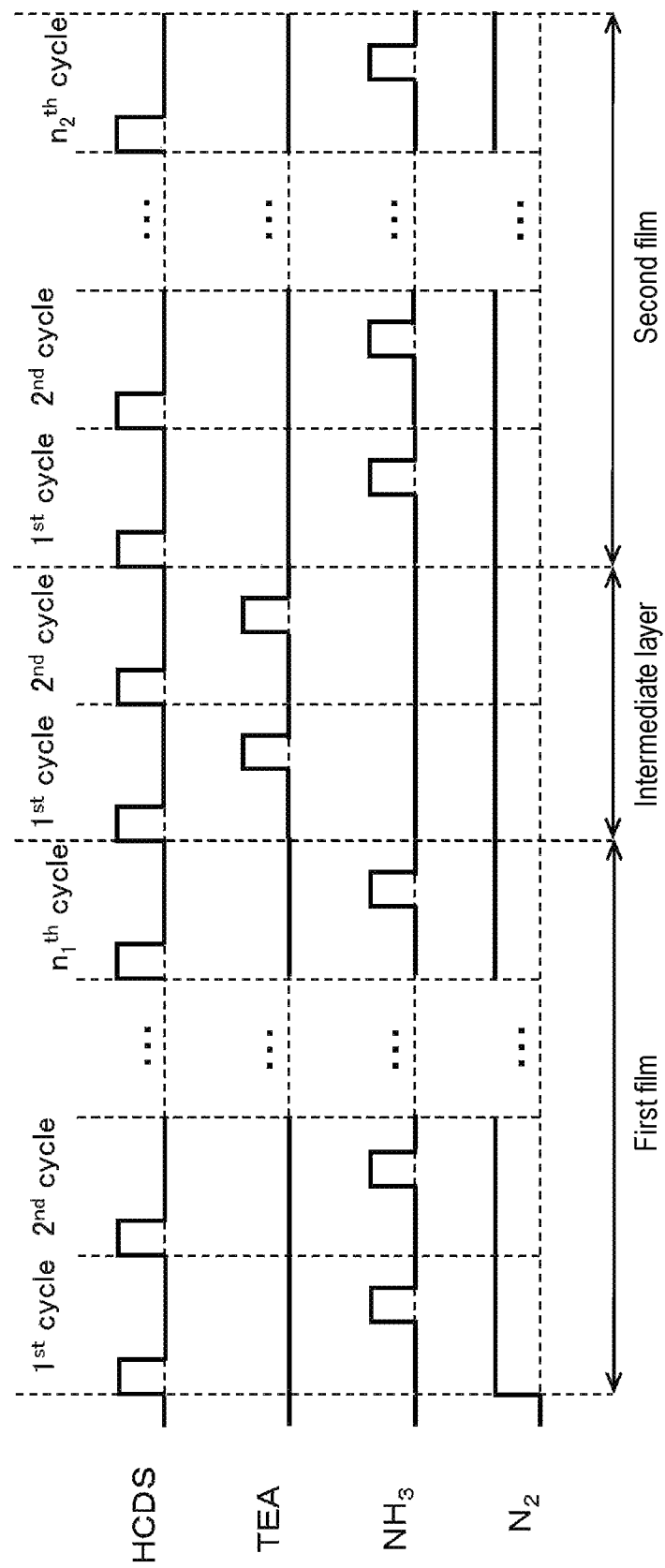
FIG. 7 is a diagram illustrating an exemplary modification to the timing of the gas supply in a film forming sequence according to one embodiment of the present disclosure.

As in the film forming sequence illustrated in FIG. 7, after the wafer 200 with the SiO film formed on a surface thereof is prepared, the first film forming step, the intermediate layer forming step, and the second film forming step may be performed without performing the seed layer forming step.

The processing procedures and processing conditions of the first film forming step in this modification may be the same as those of the first film forming step of the film forming sequence illustrated in FIG. 4. However, since the seed layer for preventing the spreading of O is not present on the SiO film, the O may spread from the SiO film to the first SiN film. In other words, the SiN film may be formed or the SiON film may be formed as the first film.

The processing procedures and processing conditions of the intermediate layer forming step in this modification may be the same as those of the intermediate layer forming step of modification 3. The intermediate layer becomes a SiCN layer. However, when the SiON film is formed as the first film, the O may slightly spread from the first film to the intermediate layer depending on the concentration of O on the surface of the first film. That is, a SiCN layer containing a small amount of O may be formed as the intermediate layer.

The processing procedures and processing conditions of the second film forming step in this modification may be the same as those of the second film forming step of modification 3. Even when the SiON film is formed as the first film, it becomes possible to make the intermediate layer serve as a block layer for suppressing the spreading of O from the first film. Thus, it becomes possible to form the second film as a SiN film not containing O. Also, similar to modification 3, the thickness of the second SiN film is set as a thickness to be consumed through a different step including the etching process, which is a step performed after the second film forming step.

The film forming sequence of this modification may be expressed as follows. Also, the film forming sequence illustrated in FIG. 7 illustrates an example in which the number of performing the cycle in the intermediate layer forming step is 2 times ($m_2$=2).

Figure 9C:
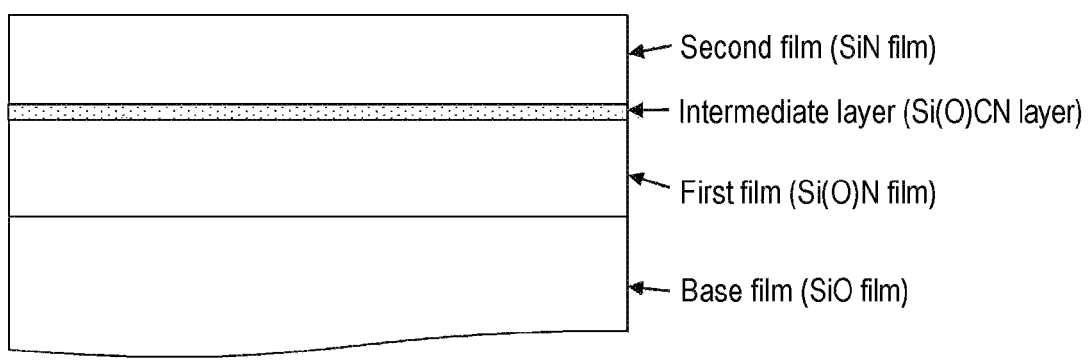
FIG. 9C is a diagram illustrating an exemplary modification in the cross-sectional structure of the protective film.

(HCDS→NH$_3$)×n$_1$→(HCDS→TEA)×m$_2$→(HCD-S→NH$_3$)×n$_2$ ⇒ SiN/Si(O)CN/Si(O)N A cross-sectional structure of the film formed on the wafer 200 by the film forming sequence of this modification is illustrated in FIG. 9C. The protective film of this modification is formed as the layered film including the first film, the intermediate layer, and the second film. Also in this modification, it becomes possible to form at least the second film as a SiN film not containing O and to enhance the function thereof as the protective film of the layered film formed by layering the first film to the second film.

Further, according to this modification, by forming the SiCN layer or a SiCN layer containing a small amount of O as the intermediate layer, the same effects as those of modification 3 may be achieved. That is to say, by forming the intermediate layer by the SiCN layer having a high etch resistance or the SiCN layer containing a small amount of O while setting the film thickness of the second film to a thickness to be consumed through a different step including the etching process, it becomes possible for the intermediate layer to remain without being consumed through the different step. As a result, at a later step in which the etch resistance is required, it becomes possible to form the outermost surface of the wafer 200 as the intermediate layer. Thus, it becomes possible to reliably protect the underlying SiO film.

In addition, according to this modification, by spreading an appropriate amount of O to the first film, it becomes possible to suitably reduce the etch resistance of the first film, and to easily and reliably remove the first film, compared with modification 3. That is, this modification is effective particularly when there is a need to finally remove the first film. Moreover, according to this modification, since there is no need to form the seed layer, it becomes possible to simplify the control of the film forming process.

(Modification 7)

After the wafer 200 with a SiO film formed on a surface thereof is prepared, the first film forming step and the cap layer forming step may be sequentially performed without performing the seed layer forming step.

The processing procedures and processing conditions of the first film forming step in this modification may be the same as those of the first film forming step of the film forming sequence illustrated in FIG. 4. However, since the seed layer for preventing the spreading of O is not present on the SiO film, the SiN film may be formed or the SiON film may be formed as the first film, as in modification 6.

The processing procedures and processing conditions of the intermediate layer forming step in this modification may be the same as those of the cap layer forming step illustrated in modification 4. The cap layer becomes a SiCN layer. However, when the SiON film is formed as the first film, the O may slightly spread from the first film to the cap layer depending on the concentration of O on the surface of the first film. That is, a SiCN layer containing a small amount of O may be formed as the cap layer.

The film forming sequence of this modification may be expressed as follows.

(HCDS→NH$_3$)×n$_1$→(HCDS→TEA)×m$_3$ ⇒ Si(O)CN/Si(O)N

According to this modification, by forming the cap layer (SiCN layer or SiCN layer containing a small amount of O) having an etch resistance higher than that of the first film on the first film, it becomes possible to enhance the function thereof as the protective film of the layered film formed by layering the first film and the cap layer. In addition, according to this modification, by spreading an appropriate amount of O to the first film, it becomes possible to suitably reduce the etch resistance of the first film, and also to easily and reliably remove the first film, compared with modification 3. That is, this modification is effective particularly when there is a need to finally remove the first film. Moreover, according to this modification, since there is no need to form the seed layer, it becomes possible to simplify the control of the film forming process.

<Other Embodiments>

While the embodiments of the present disclosure have been described above, the present disclosure is not limited to the aforementioned embodiments but may be variously modified without departing the spirit of the present disclosure.

For example, in the aforementioned embodiments, the processing procedures or processing conditions are the same in the first film forming step and the second film forming step, but these procedures or conditions may be different between these steps. For example, at these steps, the order of supplying gases may be different. In addition, for example, at these steps, the type of the precursor gas may be different or the type of the reaction gas may be different. Also, for example, at these steps, the processing conditions such as the temperature of the wafer 200, the internal pressure of the process chamber 201, and the supply flow rate or the supply time of each gas may be different.

Further, at least any one of the first film forming step and the second film forming step, a cycle of simultaneously performing the step of supplying the HCDS gas to the wafer 200 and the step of supplying the NH$_3$ gas to the wafer 200 may be performed a predetermined number of times (one or more times).

Also, for example, in the aforementioned embodiments, the processing procedures or processing conditions are the same in the seed layer forming step, the intermediate layer forming step, and the cap layer forming step, but the procedures or conditions may be different between these steps. For example, at these steps, the order of supplying gases may be different. Also, for example, at these steps, the type of the precursor gas may be different or the type of the reaction gas may be different. Also, for example, at these steps, the processing conditions such as the temperature of the wafer 200, the internal pressure of the process chamber 201, the supply flow rate or the supply time of each gas may be different.

The present disclosure may be appropriately applied to a case where a nitride film containing a metal element such as titanium (Ti), zirconium (Zr), hafnium (Hf), taltanum (Ta), niobium (Nb), molybdenum (Mo), tungsten (W), yttrium (Y), strontium (Sr), or aluminum (Al), i.e., a metal nitride film, is formed on the wafer 200. That is, the present disclosure may be also applied to a case where a layered film including, for example, a TiN film, a ZrN film, an HfN film, a TaN film, a NbN film, a MoN film, a WN film, a YN film, an SrN film, or an AlN film is formed on the wafer 200.

For example, the present disclosure may be also appropriately applied to a case where a layered film including a TiN film is formed on a SiO film formed on the surface of the wafer 200 by the film forming sequence illustrated below, using a gas containing Ti of titanium tetrachloride (TiCl$_4$) or the like, and a chloro group, as a precursor gas.

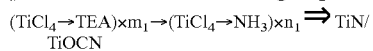

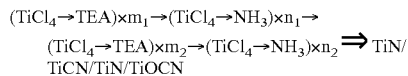

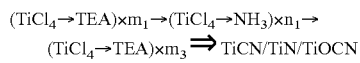

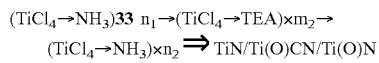

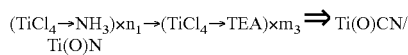

The processing procedures and processing conditions in these cases may be the same as those of the aforementioned embodiments or modifications. Also in these cases, the same effects as those of the aforementioned embodiments or modifications may be achieved. That is, the present disclosure may be appropriately applied to a case where a semiconductor nitride film or a metal nitride film is formed.

Preferably, the recipes used in the substrate processing (programs in which the processing procedures, processing conditions, or the like are written) may be individually prepared according to the processing contents (a film type of a film to be formed, a composition ratio, a film quality, a film thickness, processing procedures, processing conditions, and the like), and stored in advance in the memory device 121c via an electrical communication line or the external memory device 123. In addition, at the start of the substrate processing, preferably, the CPU 121a appropriately selects a suitable recipe from among the plurality of recipes stored in the memory device 121c according to the processing contents. This enables a single substrate processing apparatus to form films having different film types, composition ratios, film qualities, and film thicknesses with high reproducibility. Further, this can reduce an operator's operation burden (a burden borne by an operator when inputting the processing procedures or processing conditions, or the like), thereby avoiding a manipulation error and quickly starting the substrate processing.

The recipes described above are not limited to newly prepared ones but may be prepared by, for example, modifying the existing recipes already installed in the substrate processing apparatus. In the case of modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there has been described an example in which films are formed using a batch-type substrate processing apparatus capable of processing a plurality of substrates at a time. The present disclosure is not limited to the aforementioned embodiments but may be also appropriately applied to, for example, a case where films are formed using a single-wafer-type substrate processing apparatus capable of processing one or several substrates at a time. In addition, in the aforementioned embodiments, there have been described examples in which films are formed using a substrate processing apparatus having a hot-wall-type processing furnace. The present disclosure is not limited to the aforementioned embodiments but may be also appropriately applied to a case where films are formed using a substrate processing apparatus having a cold-wall-type processing furnace. Also in these cases, the processing procedures and processing conditions may be the same as, for example, those of the aforementioned embodiments.

Figure 12A:
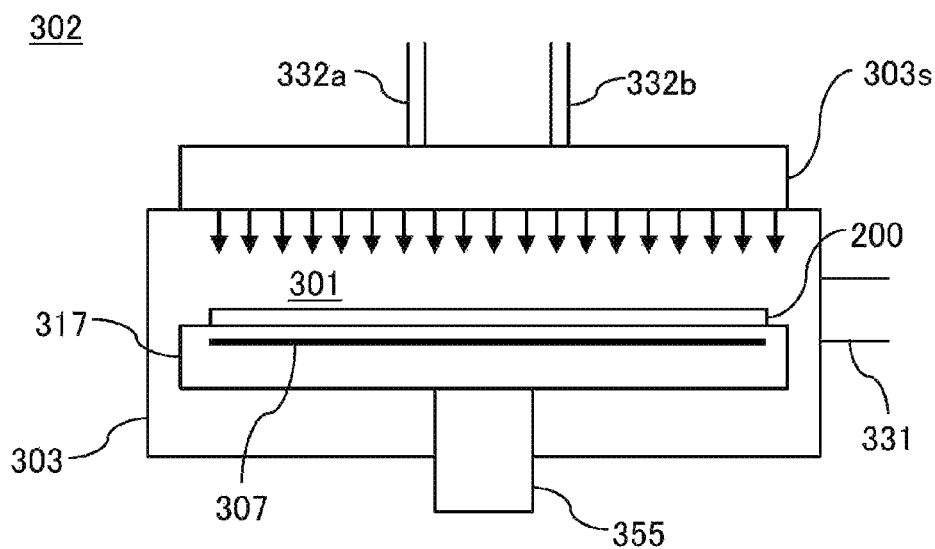
FIG. 12A is a schematic configuration diagram of a processing furnace of a substrate processing apparatus applicably used in another embodiment of the present disclosure, where the processing furnace part is illustrated in a longitudinal cross-sectional view.

For example, the present disclosure may be also appropriately applied to a case where films are formed using a substrate processing apparatus having a processing furnace 302 illustrated in FIG. 12A. The processing furnace 302 includes a process vessel 303 forming a process chamber 301, a shower head 303s serving as a gas supply part for supplying a gas in the form of a shower into the process chamber 301, a support table 317 configured to support one or several wafers 200 in a horizontal posture, a rotary shaft 355 configured to support the support table 317 from below, and a heater 307 installed in the support table 317. An inlet (gas introduction port) of the shower head 303s is connected with gas supply ports 332a and 332b. The gas supply port 332a is connected with a supply system like the precursor gas supply system of the aforementioned embodiments. The gas supply port 332b is connected with a gas supply system like the reaction gas supply system of the aforementioned embodiments. A gas distribution plate for supplying a gas in the form of a shower into the process chamber 301 is installed in an outlet (gas discharging port) of the shower head 303s. The shower head 303s is installed at a position facing the surface of the wafer 200 loaded into the process chamber 301. An exhaust port 331 for exhausting the interior of the process chamber 301 is installed in the process vessel 303. The exhaust port 331 is connected with an exhaust system like the exhaust system of the aforementioned embodiments.

Figure 12B:
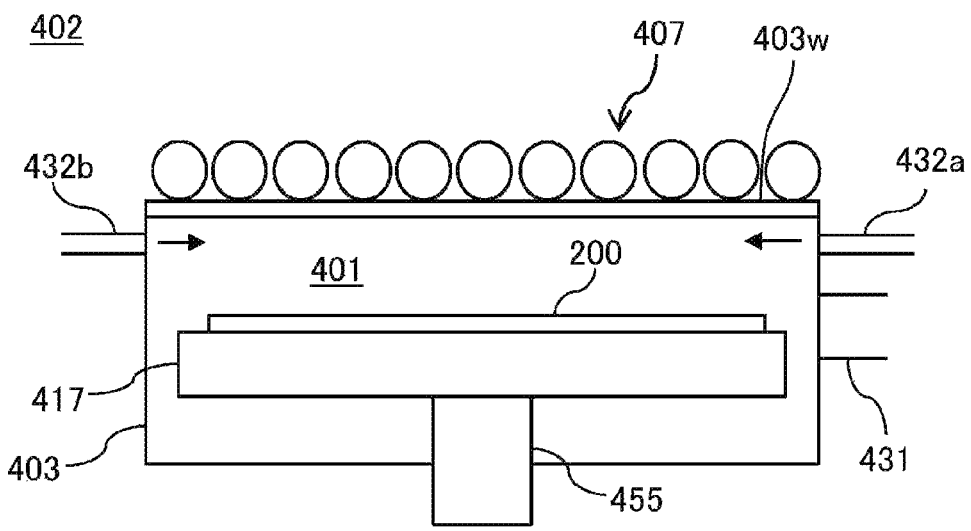
FIG. 12B is a schematic configuration diagram of a processing furnace of a substrate processing apparatus applicably used in another embodiment of the present disclosure, where the processing furnace part is illustrated in a longitudinal cross-sectional view.

In addition, for example, the present disclosure may be also appropriately applied to a case where films are formed using a substrate processing apparatus having a processing furnace 402 illustrated in FIG. 12B. The processing furnace 402 includes a process vessel 403 forming a process chamber 401, a support table 417 configured to support one or several wafers 200 in a horizontal posture, a rotary shaft 455 configured to support the support table 417 from below, a lamp heater 407 configured to irradiate light toward the wafers 200 in the process vessel 403, and a quartz window 403w configured to allow the light irradiated from the lamp heater 407 to transmit therethrough. The process vessel 403 is connected with gas supply ports 432a and 432b. The gas supply port 432a is connected with a supply system like the precursor gas supply system of the aforementioned embodiments. The gas supply port 432b is connected with a supply system like the reaction gas supply system of the aforementioned embodiments. The gas supply ports 432a and 432b are respectively installed on sides of the end portions of the wafer 200 loaded into the process chamber 301, namely, at positions that do not face the surface of the wafer 200 loaded into the process chamber 301. An exhaust port 431 for exhausting the interior of the process chamber 401 is installed in the process vessel 403. The exhaust port 431 is connected with an exhaust system like the exhaust system in the aforementioned embodiments.

The first substrate processing part for performing the film forming process or the second substrate processing part for performing the etching process may not be limited to a case where each of them is configured as an independent device (stand-alone type device) group, but may be configured as a single device (cluster type device) mounted on the same platform.

Even when these substrate processing apparatuses are used, the film forming process may be performed under the same processing procedures and processing conditions as those of the aforementioned embodiments or modifications, and the same effects as those of the aforementioned embodiments or modifications may be achieved.

Also, the embodiment and modifications described above may be appropriately combined with each other to be used. In this case, the processing procedures and processing conditions may be the same as, for example, those of the aforementioned embodiments.

EXAMPLES

The experiment results supporting the effects achieved in the aforementioned embodiments will now be described.

As sample 1, a protective film was formed by layering a seed layer (SiOCN layer), a SiN film, and a cap layer (SiCN layer) on a SiO film formed on the surface of the wafer by the film forming sequence illustrated in FIG. 6 using the substrate processing apparatus of the aforementioned embodiments. An HCDS gas as a precursor gas, a TEA gas as a gas containing C and N, and a $NH_3$ gas as an N-containing gas were used. The processing conditions were within the range of the processing conditions described in the aforementioned embodiments. After the protective film was formed, the temperature of the wafer was set at a room temperature and the wafer was transferred into the atmosphere.

As sample 2, a SiN film as the protective film was formed on the SiO film formed on the surface of the wafer by non-simultaneously performing a step of supplying the HCDS gas to the wafer and a step of supplying a $NH_3$ gas to the wafer a predetermined number of times using the substrate processing apparatus of the aforementioned embodiments. The processing conditions at each step were within the range of the processing conditions described at the first film forming step described above. After the protective film was formed, the temperature of the wafer was set at a room temperature and the wafer was transferred into the atmosphere.

Figure 10:
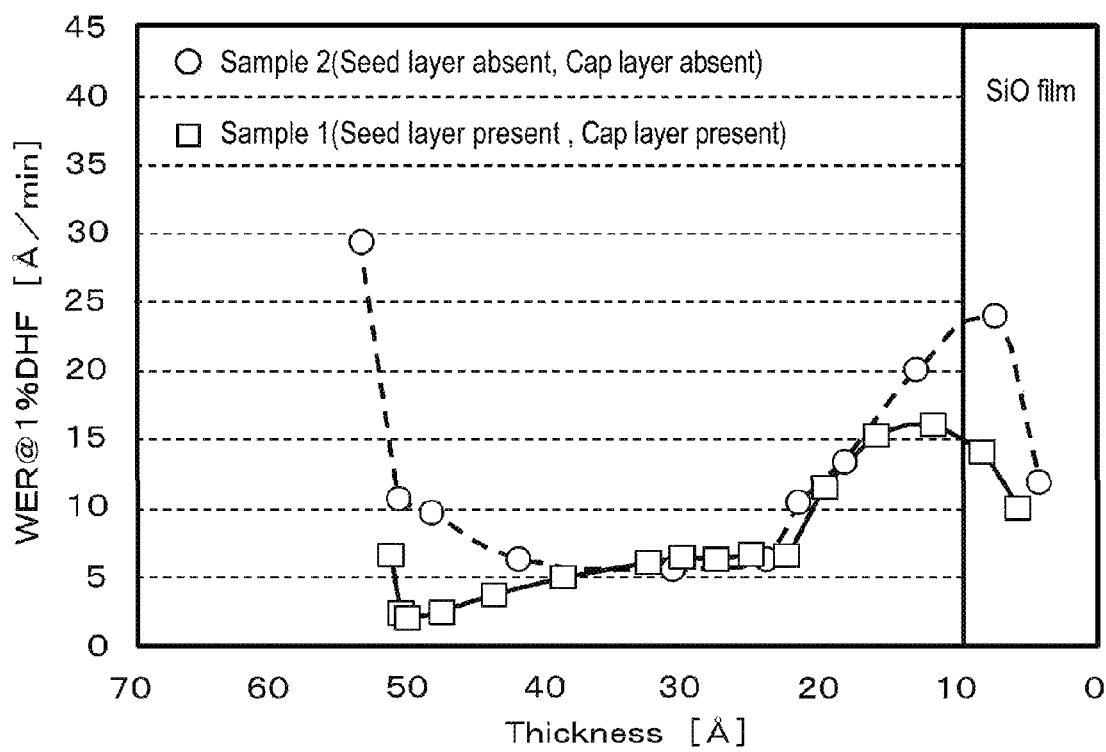
FIG. 10 is a diagram illustrating the evaluation results of etch resistance of the protective film.

Then, the etch resistances (process tolerances) of the protective films of samples 1 and 2 were measured. FIG. 10 is a diagram illustrating a profile of a wet etching rate (WER) in a depth direction when the protective film of each sample was etched using an HF aqueous solution having a concentration of 1%. The vertical axis of FIG. 10 represents the WER (Å/min) of the protective film. The horizontal axis of FIG. 10 represents a total thickness (Å) of the SiO film and the protective film. An interface between the SiO film and the protective film is present in a position of the horizontal axis 10 (Å). In FIG. 10, the mark □ represents sample 1 and the mark ○ represents sample 2.

According to FIG. 10, it can be seen that, in a range of 10 or 15 Å (a range of 5 Å or less from the interface) in the horizontal axis, the WER of the protective film formed in sample 1 is smaller than the WER of the protective film formed in sample 2. This result is considered to be from the following reasons. First, it is considered that the reason why the WER of the protective film formed in sample 2 is relatively large (an etch resistance is relatively low) is because O contained in the underlying SiO film spreads to the SiN film to form a degradation layer (SiON layer) having an etch resistance lower than that of the SiN film near the interface between the SiN film and the SiO film. In contrast, it is considered that the reason why the WER of the protective film formed in sample 1 is relatively small (an etch resistance is relatively high) is because the seed layer (SiOCN layer) formed on the SiO film contains C and thus it has an etch resistance higher than that of the SiON layer. In addition, another reason may be that, as the seed layer serves as a block layer for suppressing the spreading of O, the spreading of O to the SiN film is suppressed so that a degradation of etch resistance near the interface between the SiN film and the seed layer is suppressed.

Furthermore, according to FIG. 10, it can be seen that, in the range of 50 Å or greater in the horizontal axis, the WER of the protective film formed in sample 1 is smaller than that of the protective film formed in sample 2. This result is considered to be from the following reasons. First, it is considered that the reason why the WER of the protective film formed in sample 2 is relatively large (an etch resistance is relatively low) is because, when the wafer 200 is transferred into the atmosphere after the protective film is formed, O contained in the atmosphere spreads to the SiN film to form a degradation layer (SiON layer) having an etch resistance lower than that of the SiN film on the surface of the SiN film. In contrast, it is considered that the reason why the WER of the protective film formed in sample 1 is relatively small (an etch resistance is relatively high) is because, when the wafer 200 is transferred into the atmosphere after the protective film is formed, the cap layer (SiCN layer) is modified to a SiOCN layer where the SiOCN layer containing C has an etch resistance higher than that of the SiON layer. Also, another reason may be that, as the cap layer serves as a block layer for suppressing the spreading of O, the spreading of O to the SiN film is suppressed so that a degradation of etch resistance near the interface between the SiN film and the cap layer is suppressed.

Next, as sample 3, a seed layer (SiOCN layer) was formed on the SiO film formed on the surface of the wafer by the same processing procedures as those of the seed layer forming step of the film forming sequence illustrated in FIG. 4 using the substrate processing apparatus of the aforementioned embodiments. Thereafter, a SiN film was formed on the seed layer by performing a cycle of simultaneously performing a step of supplying an HCDS gas to the wafer and a step of supplying a NH$_3$ gas to the wafer a predetermined number of times. The processing conditions were within the processing conditions described in the seed layer forming step and the first film forming step of the film forming sequence illustrated in FIG. 4. After a protective film was formed by layering the seed layer and the SiN film, the wafer was transferred into the atmosphere to modify the surface of the SiN film. The temperature of the wafer when transferred was set to be higher than that when the SiN film was formed, here, to fall within a range of 680 to 720 degrees C.

As sample 4, a seed layer (SiOCN layer) and a SiN film were formed on the SiO film formed on the surface of the wafer by the same processing procedures and processing conditions as those when sample 3 was formed using the substrate processing apparatus of the aforementioned embodiments. After a protective film was formed by layering the seed layer and the SiN film, the wafer was transferred into the atmosphere to modify the surface of the SiN film. The temperature of the wafer when transferred was set to be lower than that when the SiN film was formed, here, to fall within a range of 400 to 450 degrees C.

As sample 5, a seed layer (SiOCN layer) and a SiN film were formed on the SiO film formed on the surface of the wafer by the same processing procedures as those of the seed layer forming step and the first film forming step of the film forming sequence illustrated in FIG. 4, namely, by a film forming sequence of non-simultaneously performing a step of supplying an HCDS gas to the wafer and a step of supplying a NH$_3$ gas to the wafer, using the substrate processing apparatus of the aforementioned embodiments. The processing conditions were within the processing conditions described in the seed layer forming step and the first film forming step of the film forming sequence illustrated in FIG. 4. After a protective film was formed by layering the seed layer and the SiN film, the wafer was transferred into the atmosphere to modify the surface of the SiN film. The temperature of the wafer when transferred was set to be higher than that when the SiN film was formed, here, to fall within a range of 680 to 720 degrees C.

As sample 6, a seed layer (SiOCN layer) and a SiN film were formed on the SiO film formed on the surface of the wafer by the same processing procedures as those when sample 5 was formed using the substrate processing apparatus of the aforementioned embodiments. After a protective film was formed by layering the seed layer and the SiN film, the wafer was transferred into the atmosphere to modify the surface of the SiN film. The temperature of the wafer when transferred was set to be lower than that when the SiN film was formed, here, to fall within a range of 400 to 450 degrees C.

Figure 11A:
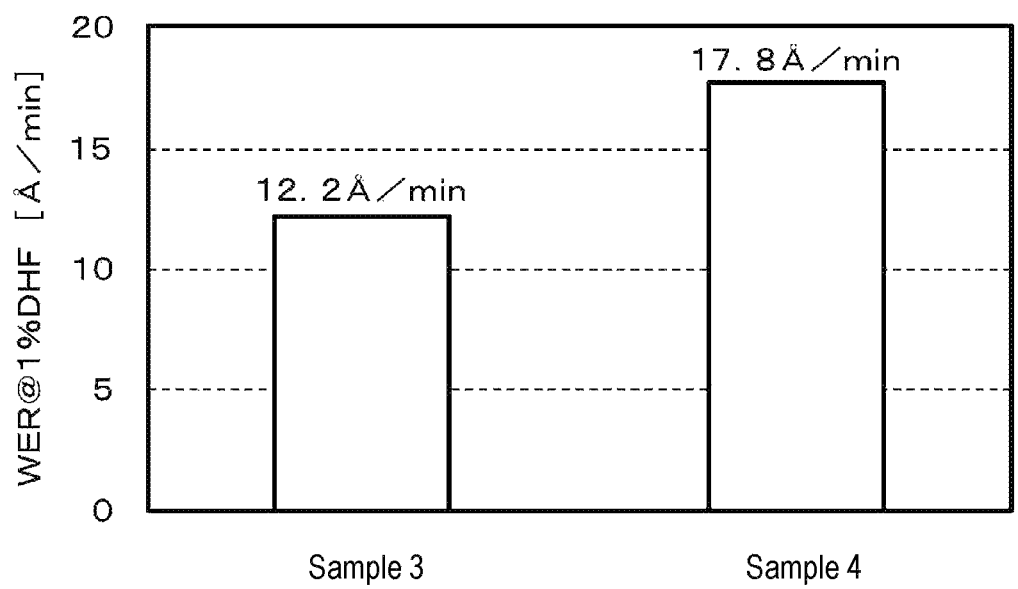
FIG. 11A is a diagram illustrating other evaluation results of etch resistance of the protective film and FIG. 11B is a diagram illustrating other evaluation results of etch resistance of the protective film.
Figure 11B:
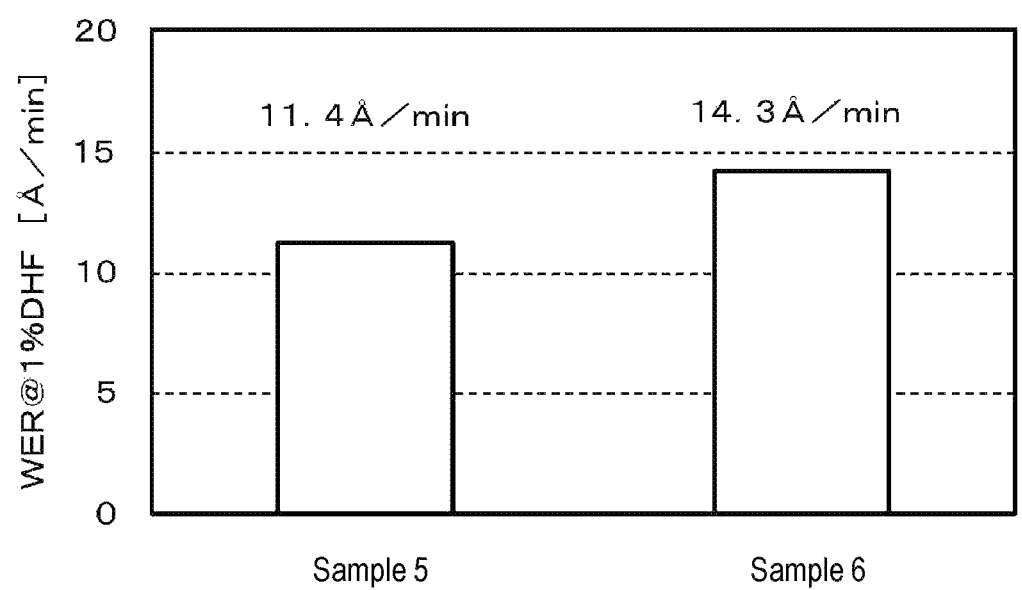

Then, the etch resistances (process tolerances) on the surfaces of the protective films of samples 3 to 6 were measured, respectively. FIG. 11A is a diagram illustrating WER when the surfaces of the protective films of samples 3 and 4 were etched using an HF aqueous solution having a concentration of 1%, and FIG. 11B is a diagram illustrating WERs when the surfaces of the protective films of samples 5 and 6 were etched using an HF aqueous solution having a concentration of 1%. The vertical axes of FIGS. 11A and 11B represent WERs (Å/min) of the protective films, respectively. The horizontal axis of FIG. 11A represents samples 3 and 4, and the horizontal axis of FIG. 11B represents samples 5 and 6.

According to FIGS. 11A and 11B, it can be seen that the WERs of the protective films formed in samples 3 and 5 are smaller than the WERs of the protective films formed in samples 4 and 6, respectively. That is, it can be seen that the fact that the temperature of the wafer when transferred into the atmosphere was set to be higher than that when the SiN film was formed has a more improved etch resistance of the surface than that when the temperature of the wafer was set to be lower than that when the SiN film was formed. This is considered to be because, by setting the temperature of the wafer when transferred into the atmosphere to be higher than that when the SiN film is formed, not only O contained in the atmosphere but also C contained in the atmosphere is added to the surface of the SiN film.

<Aspects of the Present Disclosure>

Hereinafter, some aspects of the present disclosure will be additionally stated as supplementary notes.

(Supplementary Note 1)

According to one aspect of the present disclosure, there is provided a method of manufacturing a semiconductor device or a method of processing a substrate, including:

providing a substrate;

forming a nitride film (containing oxygen) as a first film on the substrate performing, a predetermined number of times, a cycle of non-simultaneously performing a process of supplying a precursor gas to the substrate, a process of supplying a carbon-containing gas to the substrate, and a process of supplying a nitrogen-containing gas to the substrate, or performing, a predetermined number of times, a cycle of non-simultaneously performing a process of supplying a precursor gas to the substrate and a process of supplying a gas containing carbon and nitrogen to the substrate, or performing, a predetermined number of times, a cycle of non-simultaneously performing a process of supplying a precursor gas containing carbon to the substrate and a process of supplying a nitrogen-containing gas to the substrate, to form a nitride layer containing carbon as an intermediate layer on the first film; and forming a nitride film (which does not contain oxygen) as a second film on the intermediate layer, wherein a thickness of the second film is set to a thickness to be consumed (dissipated) through a different process performed after the act of forming the second film and including at least an etching process.

Preferably, in the act of forming the first film and in the act of forming the second film, a cycle of simultaneously or non-simultaneously performing the process of supplying the precursor gas to the substrate and the process of supplying the nitrogen-containing gas to the substrate are performed a predetermined number of times.

(Supplementary Note 2)

In the method of Supplementary Note 1, preferably, the intermediate layer remains without being consumed (dissipated) through the different process.

(Supplementary Note 3)

In the method of Supplementary Note 1, preferably, an outmost surface of the substrate is turned into the intermediate layer (in a process requiring an etch resistance) by causing the second film to be consumed through the different process.

According to the present disclosure in some embodiments, it is possible to suppress degradation of the function of a nitride film as a protective film.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    forming a seed layer containing oxygen and carbon on a substrate;
    forming a nitride film containing no oxygen and carbon on the seed layer; and
    forming a nitride layer containing carbon as a cap layer on the nitride film by:
        performing, a predetermined number of times, a cycle of non-simultaneously performing a process of supplying a precursor gas to the substrate, a process of supplying a carbon-containing gas to the substrate, and a process of supplying a nitrogen-containing gas to the substrate; or
        performing, a predetermined number of times, a cycle of non-simultaneously performing a process of supplying a precursor gas to the substrate and a process of supplying a gas containing carbon and nitrogen to the substrate; or
        performing, a predetermined number of times, a cycle of non-simultaneously performing a process of supplying a precursor gas containing carbon to the substrate and a process of supplying a nitrogen-containing gas to the substrate.

2. The method of claim 1, wherein in the act of forming the nitride layer containing carbon, the cycle of non-simultaneously performing the process of supplying the precursor gas to the substrate and the process of supplying the gas containing carbon and nitrogen to the substrate is performed a predetermined number of times, and an amine-based gas or an organic hydrazine-based gas is used as the gas containing carbon and nitrogen.

3. The method of claim 1, wherein in the act of forming the nitride layer containing carbon, the cycle of non-simultaneously performing the process of supplying the precursor gas to the substrate and the process of supplying the gas containing carbon and nitrogen to the substrate is performed a predetermined number of times, and an amine-based gas is used as the gas containing carbon and nitrogen.

4. The method of claim 1, wherein a thickness of the cap layer is set within a range from 0.05 nm to 0.3 nm.

5. The method of claim 1, wherein a thickness of the cap layer is set within a range from 0.1 nm to 0.2 nm.

6. The method of claim 1, wherein the substrate with the cap layer formed thereon is exposed to an atmosphere to introduce oxygen contained in the atmosphere into the cap layer so as to modify at least a portion of the cap layer to a nitride layer containing oxygen and carbon.

7. The method of claim 1, wherein the nitride film is formed by performing, a predetermined number of times, a cycle of simultaneously or non-simultaneously performing a process of supplying a precursor gas to the substrate and a process of supplying a nitrogen-containing gas to the substrate.

8. The method of claim 1, wherein the nitride film is formed on an oxide film, which is formed on the surface of the substrate, by performing, a predetermined number of times, a cycle of simultaneously or non-simultaneously performing a process of supplying a precursor gas to the substrate and a process of supplying a nitrogen-containing gas to the substrate.

9. A substrate processing apparatus, comprising:
    a process chamber in which a substrate is processed;
    a supply system configured to supply gas to the substrate in the process chamber; and
    a control part configured to control the supply system to perform, after forming a seed layer containing oxygen and carbon on a substrate and forming a nitride film containing no oxygen and carbon on the seed layer, forming a nitride layer containing carbon as a cap layer on the nitride film by:
        performing, a predetermined number of times, a cycle of non-simultaneously performing a process of supplying a precursor gas to the substrate, a process of supplying a carbon-containing gas to the substrate, and a process of supplying a nitrogen-containing gas to the substrate; or
        performing, a predetermined number of times, a cycle of non-simultaneously performing a process of supplying a precursor gas to the substrate and a process of supplying a gas containing carbon and nitrogen to the substrate; or
        performing, a predetermined number of times, a cycle of non-simultaneously performing a process of supplying a precursor gas containing carbon to the substrate and a process of supplying a nitrogen-containing gas to the substrate.

10. A non-transitory computer-readable recording medium storing a program that causes a computer to perform a process comprising:
    forming a seed layer containing oxygen and carbon on a substrate;
    forming a nitride film containing no oxygen and carbon on the seed layer; and
    forming a nitride layer containing carbon as a cap layer on the nitride film by:
        performing, a predetermined number of times, a cycle of non-simultaneously performing a process of supplying a precursor gas to the substrate, a process of supplying a carbon-containing gas to the substrate, and a process of supplying a nitrogen-containing gas to the substrate; or performing, a predetermined number of times, a cycle of non-simultaneously performing a process of supplying a precursor gas to the substrate and a process of supplying a gas containing carbon and nitrogen to the substrate; or performing, a predetermined number of times, a cycle of non-simultaneously performing a process of supplying a precursor gas containing carbon to the substrate and a process of supplying a nitrogen-containing gas to the substrate.

* * * * *